United States Patent

Ishiwaki et al.

[11] Patent Number: 5,874,835
[45] Date of Patent: Feb. 23, 1999

[54] HIGH IMPEDANCE DETECTING CIRCUIT AND INTERFACE CIRCUIT

[75] Inventors: Masahiko Ishiwaki; Harufusa Kondoh; Hiromi Notani, all of Tokyo, Japan

[73] Assignee: Mitsubishi Denki Kabushiki Kaisha, Tokyo, Japan

[21] Appl. No.: 719,888

[22] Filed: Sep. 25, 1996

[30] Foreign Application Priority Data

May 20, 1996 [JP] Japan ..................................... 8-124440

[51] Int. Cl.$^6$ ........................ H03K 19/00; H03K 19/02
[52] U.S. Cl. ................................ 326/56; 326/57
[58] Field of Search ........................ 326/56, 57

[56] References Cited

U.S. PATENT DOCUMENTS 4,743,842 5/1988 Langone et al. ...................... 326/56
5,296,757 3/1994 Koizumi ................................ 326/56
5,598,110 1/1997 Chang .................................. 326/56

FOREIGN PATENT DOCUMENTS 60-50795 3/1985 Japan .
61-77770 4/1986 Japan .

*Primary Examiner*—Michael J. Tokar
*Assistant Examiner*—Richard Roseen
*Attorney, Agent, or Firm*—Oblon, Spivak, McClelland, Maier & Neustadt, P.C.

[57] ABSTRACT

A voltage applying means applies a voltage which determines the logical value of a node to the node, with the signal at the node fixed. Then, an applied voltage removing means removes the voltage applied by the voltage applying means. First and second detecting means detects the logical value of the node before and after the voltage application and removal of the applied voltage. A judging means compares the results of detection of the first and second detecting means to judge whether or not the node is at a high impedance.

10 Claims, 18 Drawing Sheets

FIG. 3
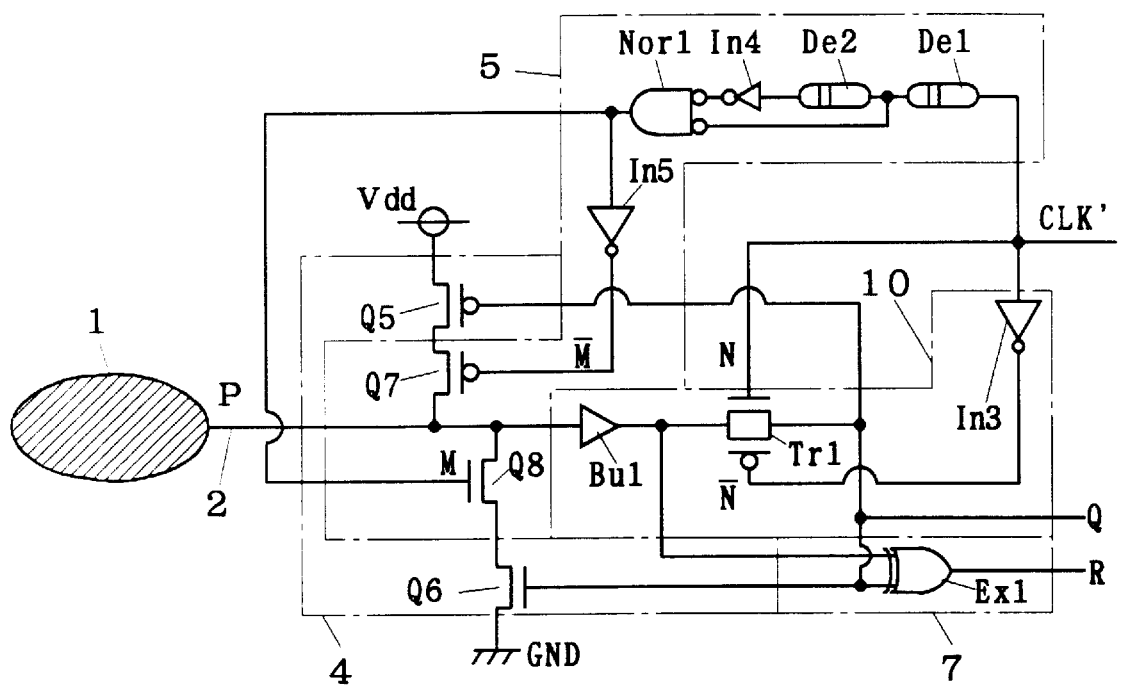
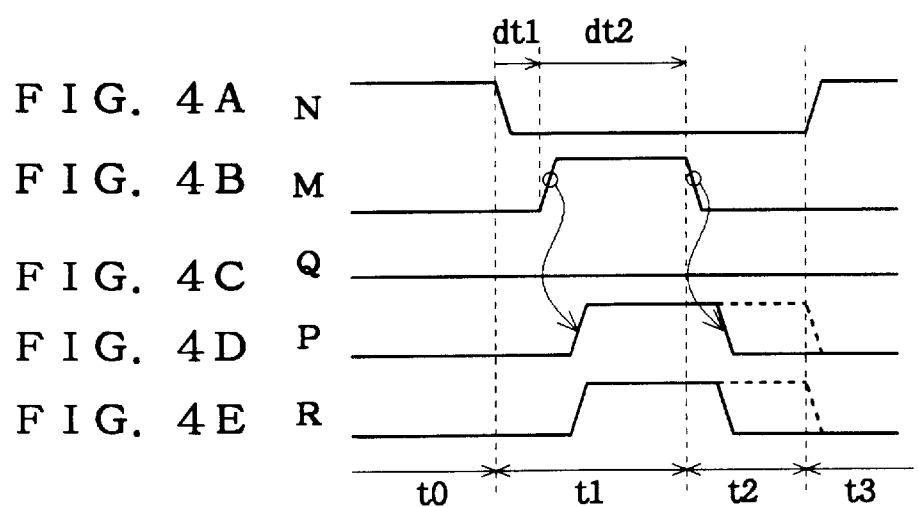
FIG. 4A  N
FIG. 4B  M
FIG. 4C  Q
FIG. 4D  P
FIG. 4E  R

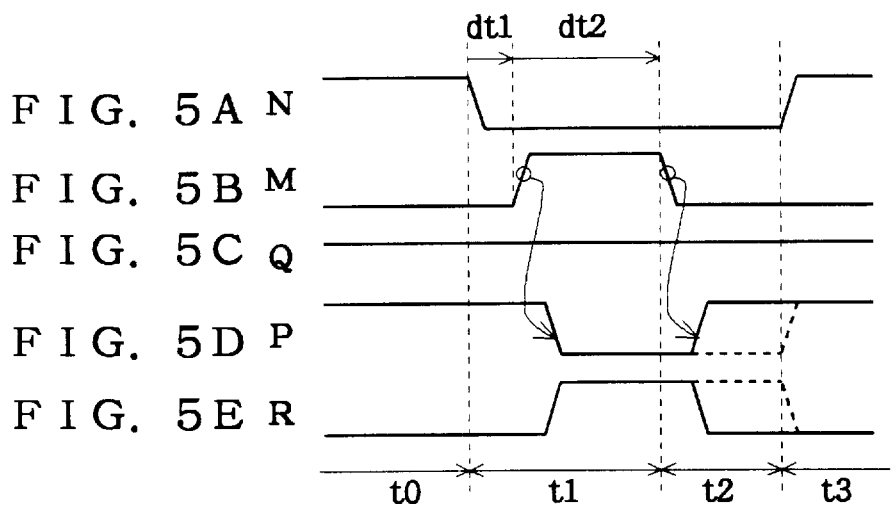
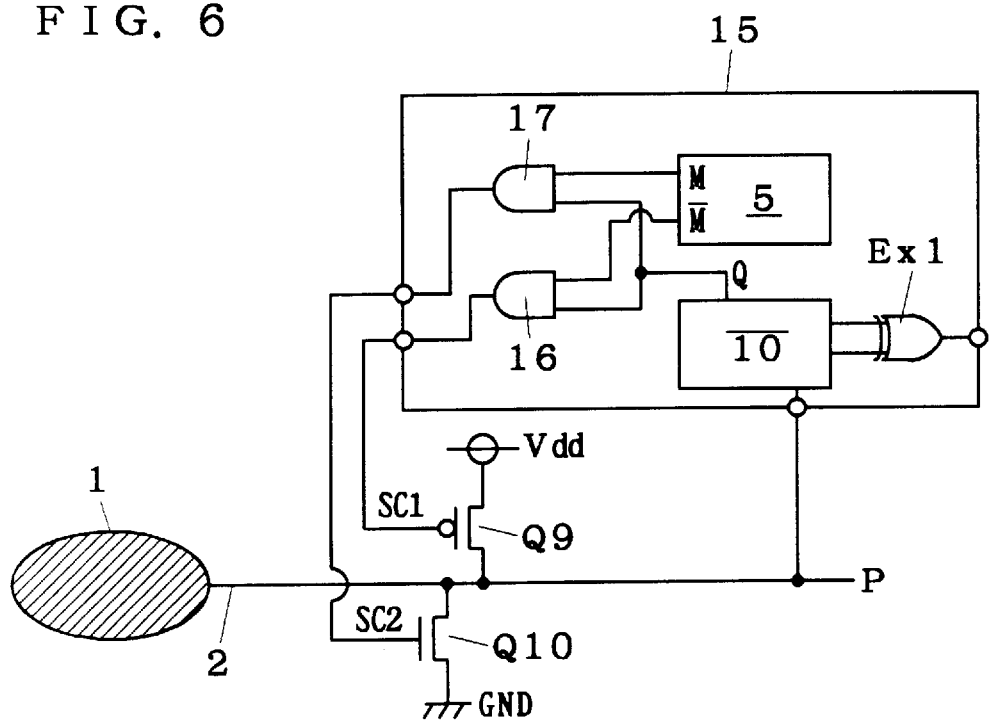

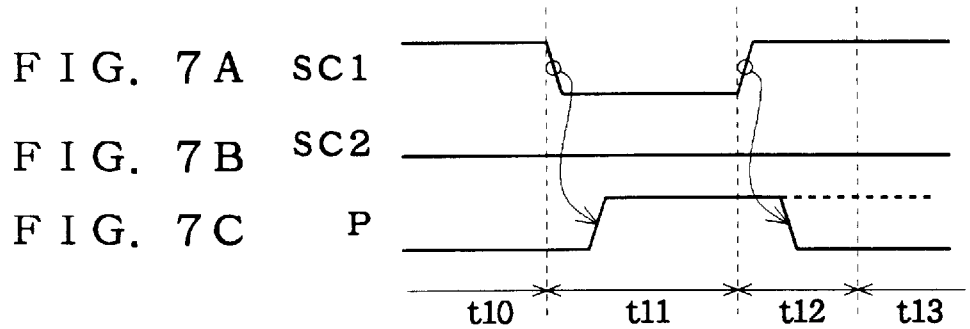
FIG. 7A SC1
FIG. 7B SC2
FIG. 7C P
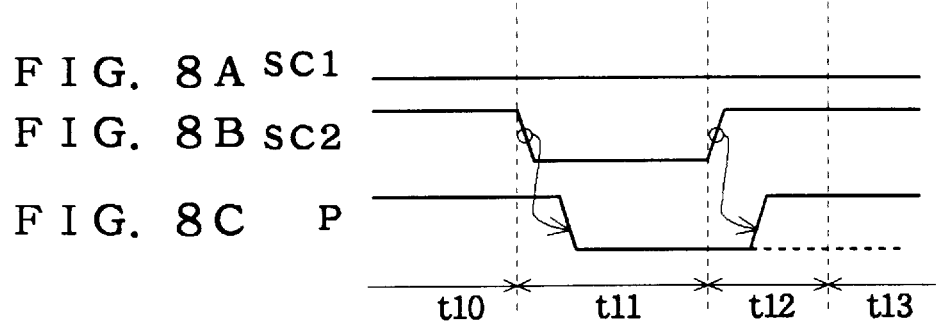
FIG. 8A SC1
FIG. 8B SC2
FIG. 8C P

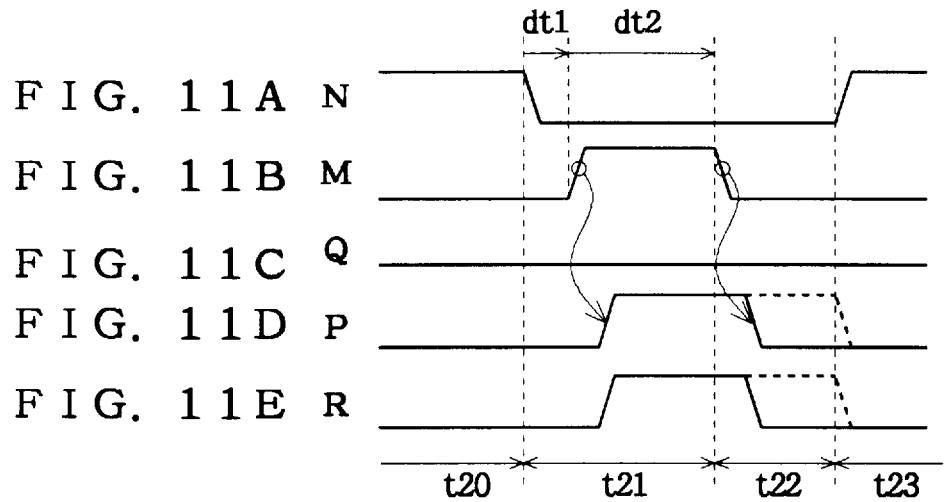
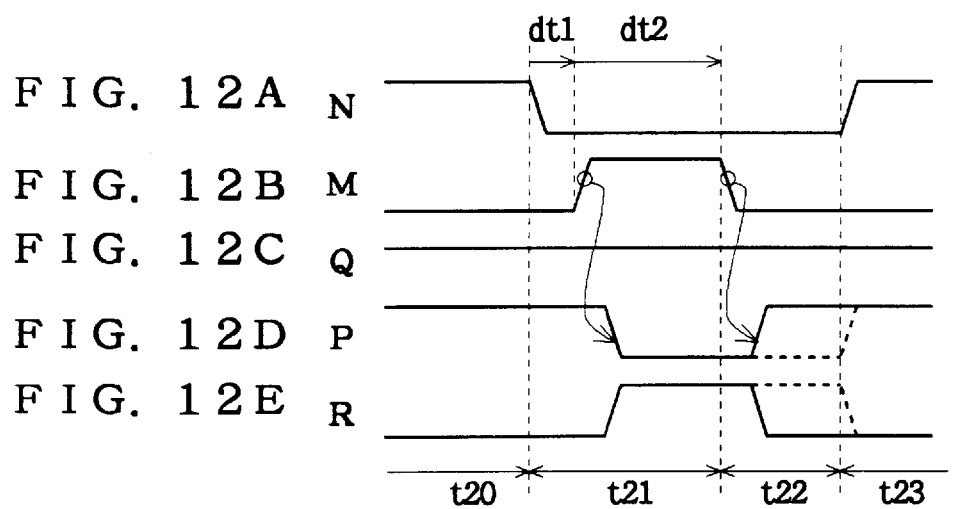

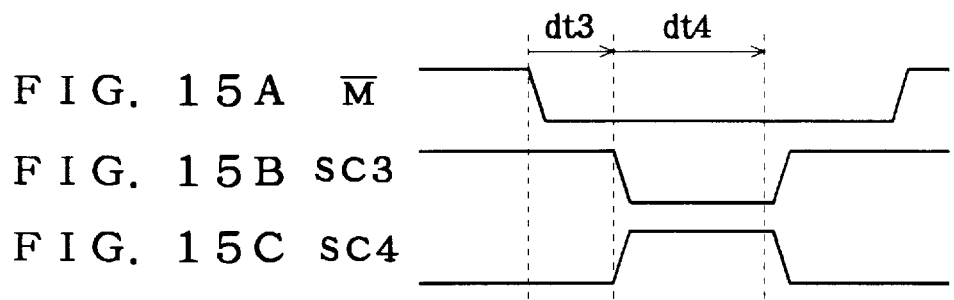
FIG. 15A M̄
FIG. 15B SC3
FIG. 15C SC4
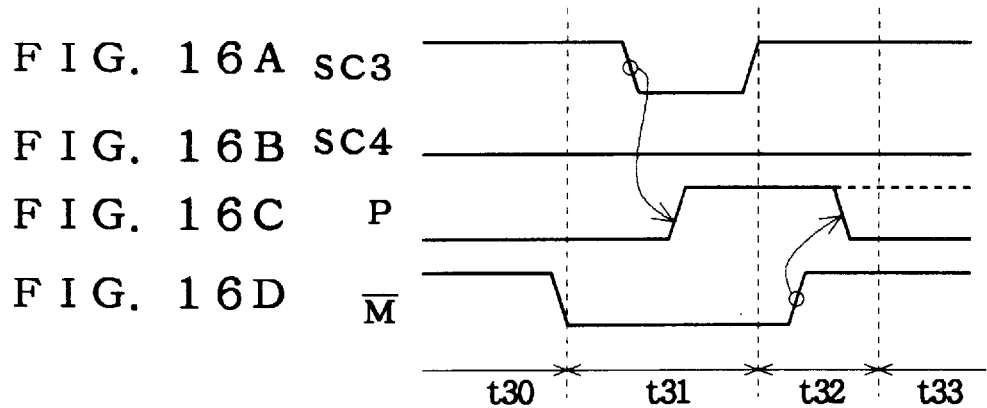
FIG. 16A SC3
FIG. 16B SC4
FIG. 16C P
FIG. 16D M̄

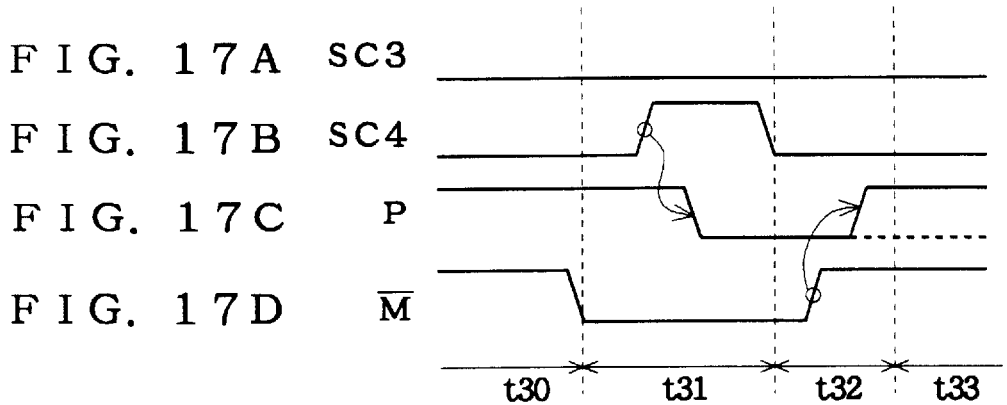
FIG. 17A SC3
FIG. 17B SC4
FIG. 17C P
FIG. 17D $\overline{M}$
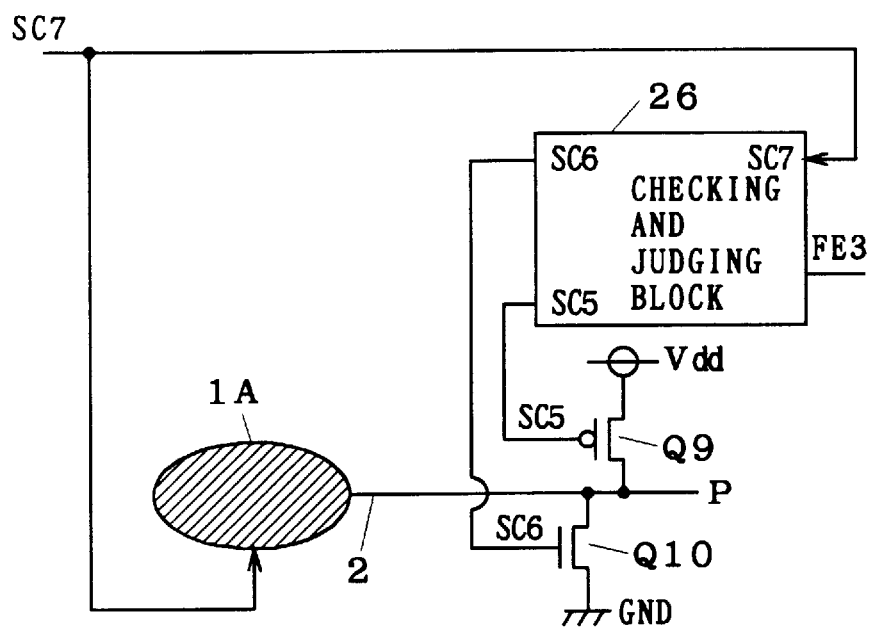
FIG. 18

FIG. 19
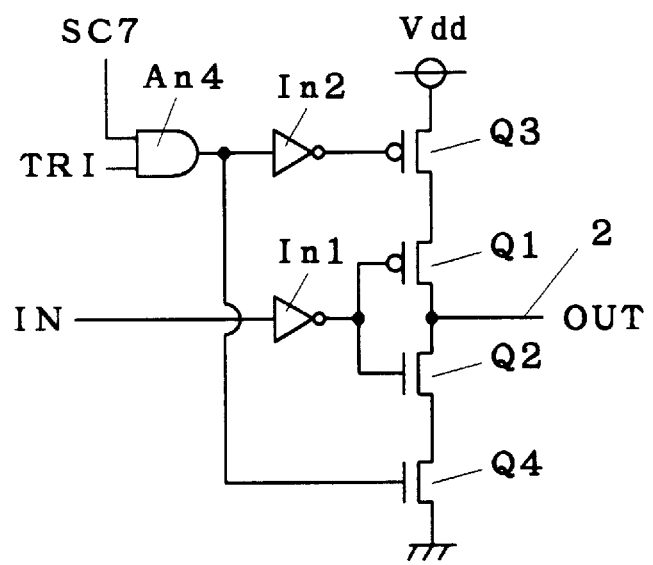
FIG. 20A SC5 
FIG. 20B SC6 
FIG. 20C P 
FIG. 20D SC7 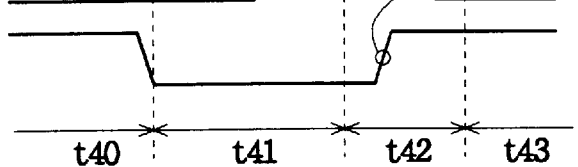

FIG. 21A SC5
FIG. 21B SC6
FIG. 21C P
FIG. 21D SC7
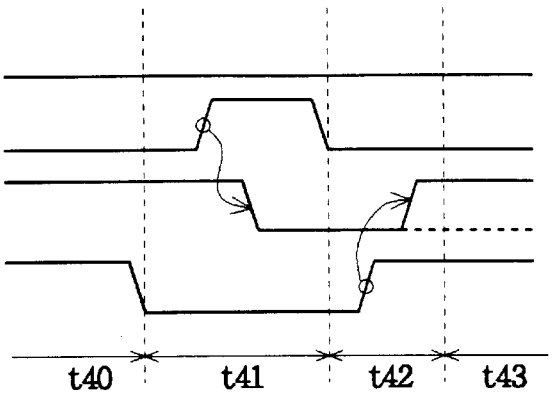
t40　t41　t42　t43
FIG. 22
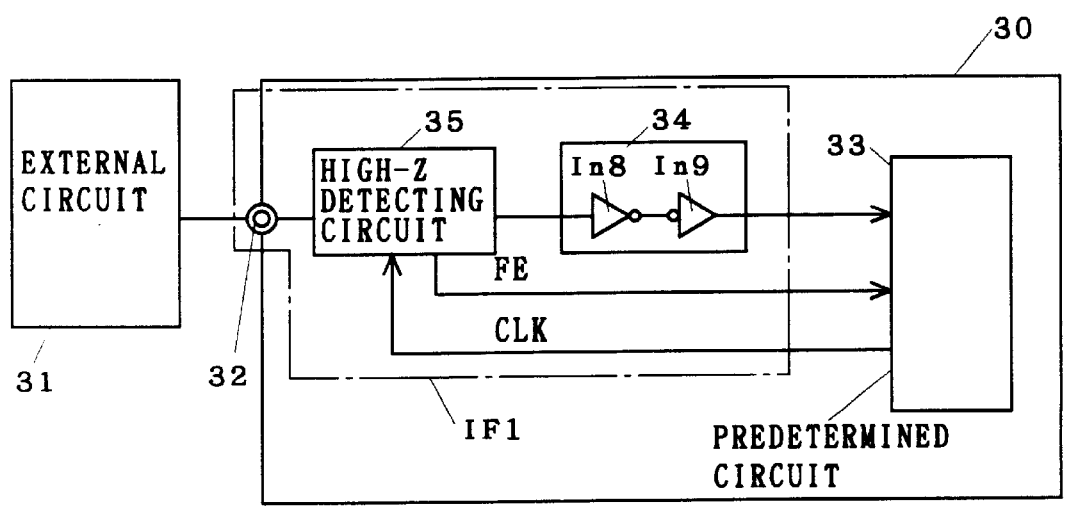

CLK

FV

FE

NU

FIG. 29
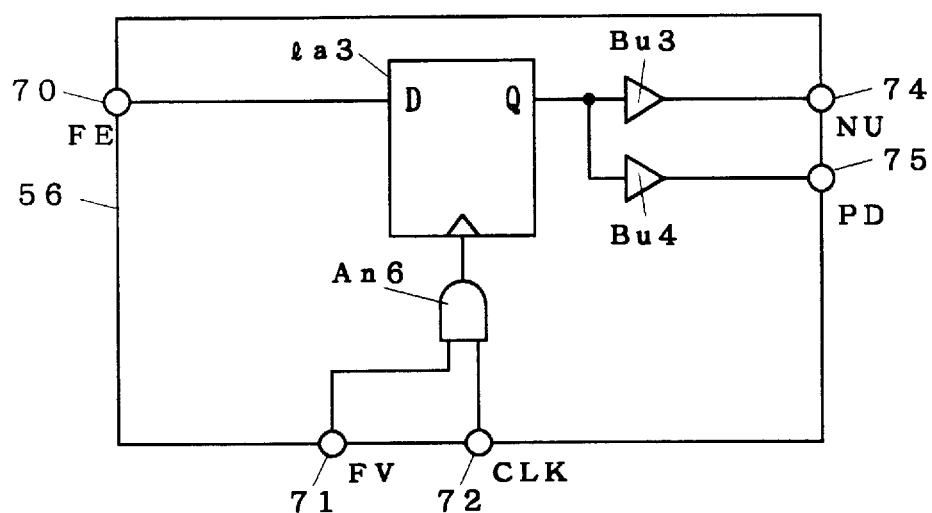
FIG. 30A
CLK
FIG. 30B
FV 
FIG. 30C
FE 
FIG. 30D
NU 
FIG. 30E
PD 

CLK

FV

100 CYCLE

SS1

SS2

SS3 t50　t51　　t52　　t53　t54

FIG. 33
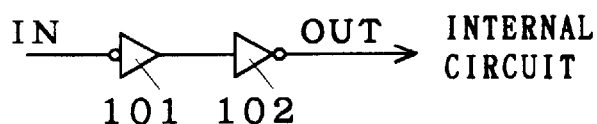
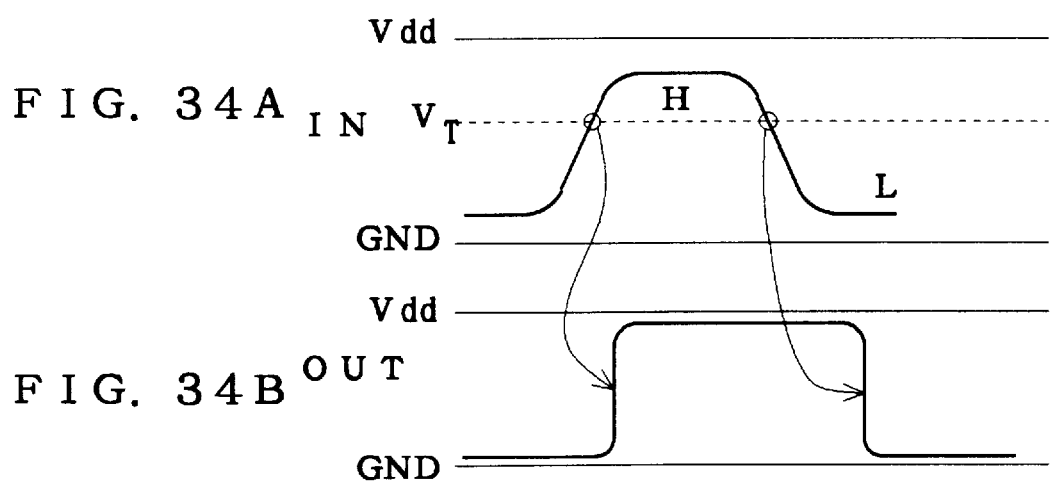

HIGH IMPEDANCE DETECTING CIRCUIT AND INTERFACE CIRCUIT

BACKGROUND OF THE INVENTION

1. Field of the Invention

The present invention relates to a high impedance detecting circuit for detecting a high impedance of a predetermined node in a digital circuit connected to an output and the like of a logic circuit. The present invention also relates to a interface circuit capable of judging the presence/absence of circuit connection.

2. Description of the Background Art

A conventional input buffer for use in a semiconductor integrated circuit having a logic circuit as an internal circuit is described below. FIG. 33 is a logic diagram of an example of the conventional input buffer including CMOS gates. The input buffer 100 comprises in-series connected CMOS inverters 101 and 102. An input terminal of the input buffer 100 is connected to an output of a predetermined logic circuit, and an output from the input buffer 100 is applied to the internal circuit.

The input buffer 100 receives a signal IN having a waveform shown in FIG. 34A. The logical value of the input signal IN is either a high level (referred to hereinafter as 'H') which is higher than a logical threshold value $V_T$ of the input buffer 100 and lower than a power supply voltage Vdd or a low level (referred to hereinafter as 'L') which is lower than the logical threshold value $V_T$ and higher than a ground voltage GND. The input buffer 100 amplifies the input signal IN to output a digital signal OUT which oscillates between the power supply voltage Vdd and the ground voltage GND as shown in FIG. 34B.

Described above is the operation of the input buffer 100 when a circuit for driving the input buffer 100 is properly connected. If an interconnecting line cut off by a failure, for example, disconnects the input terminal of the input buffer 100 from the output of the logic circuit provided at the preceding stage, the voltage of the input terminal of the input buffer 100 is unstable. In general, the voltage of the input terminal of the input buffer 100 is determined by how leak current flows. If more leak current flows from the interconnecting line for the input terminal of the input buffer 100 to the ground, the voltage of the input terminal of the input buffer 100 reaches the ground voltage GND. If more leak current flows from the interconnecting line to the power supply, the voltage of the input terminal of the input buffer 100 reaches the power supply voltage Vdd. However, since the amount of leak is generally small, the interconnecting line itself is in a high impedance (referred to hereinafter as "High-Z") state.

To detect High-Z is significant also for digital circuits handling only binary signals in terms of maintenance of the whole device including an interface circuit. However, there have been no conventional input buffers 100 including means for detecting High-Z. If High-Z is detected, a failure in a semiconductor integrated circuit may be sensed and an appropriate action such as failure indication may be performed.

There has been a device which functions to support a multiplicity of input ports to select the number of input ports to be practically used in accordance with the number of interface cards prepared, such as a network device. FIG. 35 is a perspective view of a packet converting device 120 which is one type of such network devices.

A plurality of interface cards 124 are connected to a switch card 123 through a back plane 121. In a maximum arrangement, the interface cards are connected to all connectors 122A and 122B. However, if two interface cards 124 are sufficient, the interface cards 124 are connected only to the connectors 122A and the connectors 122B are not used.

An input terminal of the connectors 122B which are not in use in an interface circuit of the packet converting device 120 is at High-Z. Detecting whether or not the input terminal of the interface circuit of the packet converting device 120 is at High-Z provides means for indicating the number of interface cards 124 connected to the packet converting device 120.

There has been an input-output interface circuit for other semiconductor integrated circuits which is adapted to apply a termination voltage Vtt to an interconnecting line, for example, through a 50Ω resistor for high speed operation. Typical examples of such an input-output interface circuit include an ECL, and an HSTL (high speed transceiver logic).

FIG. 36 is a circuit diagram of an input interface circuit for receiving an output from the HSTL disclosed, for example, in "JEDEC STANDARD No. 8-6". In FIG. 36, the reference numeral 110 designates a digital circuit; 111 designates an internal circuit in the digital circuit; 112 designates an interface circuit in the digital circuit 110 for transmitting signals therethrough between the exterior of the digital circuit 110 and the internal circuit 111; 113 designates a connector in the interface circuit 112 for connecting an external circuit to the digital circuit 110; 114 designates a voltage terminal in the interface circuit 112 for receiving the termination voltage Vtt from the digital circuit 110; 115 designates a differential amplifier circuit having a non-inverting input terminal connected to the connector 113, an inverting input terminal connected to the voltage terminal 114, and an output terminal for outputting a signal from the connector 113 which is buffered to the internal circuit 111; and the reference character R10 designates a resistor having a resistance of 50Ω and connected between the connector 113 and the voltage terminal 114.

In such high-speed interface circuits, the connector 113 when not in use is not at High-Z as above described but is connected to the interconnecting line for providing the termination voltage Vtt through the 50Ω resistor R10. Thus, the High-Z detection does not determine as to whether or not the connector 113 is in use. It should be noted that the input to the connector 113 normally has an amplitude of about Vtt±0.4 V.

The conventional digital circuit includes no High-Z detecting circuit and, accordingly, is incapable of detecting High-Z of a predetermined node in the digital circuit.

The conventional interface circuit does not have the function to detect High-Z and, hence, is incapable of judging whether or not the input terminal is in use.

Further, the conventional interface circuit having an input buffer including a differential amplifier circuit is disadvantageous in that, if the input terminal is not in use, the voltages of two input terminals of the differential amplifier circuit reach the termination voltage Vtt, which is an intermediate voltage, and are equal to each other, resulting in increased power consumption.

SUMMARY OF THE INVENTION

A first aspect of the present invention is intended for a high impedance detecting circuit connected to a predetermined node for detecting a high impedance of the predetermined node, the predetermined node being at a high or low level when the predetermined node is closed or at the high impedance when the predetermined node is open upon receipt of an output from a predetermined logic circuit. According to the present invention, the high impedance detecting circuit comprises: first detecting means for detecting a logical value of the predetermined node during a time period over which a state of the predetermined node is held; voltage applying means for applying to the predetermined node one of first and second voltages providing the high and low levels, respectively, which has a logical value opposite to the detection result of the first detecting means; applied voltage removing means for removing the voltage applied by the voltage applying means to permit the predetermined node to be re-driven by the predetermined logic circuit; second detecting means for detecting a logical value of the predetermined node after the applied voltage removal; and judging means for judging the high impedance of the predetermined node on the basis of the detection results of the first and second detecting means.

Preferably, according to a second aspect of the present invention, the voltage applying means and the applied voltage removing means include first and second switching elements connected in series between a node for providing the first voltage and the predetermined node, the first and second switching elements being turned on and off according to first and second control signals, respectively, and third and fourth switching elements connected in series between a node for providing the second voltage and the predetermined node, the third and fourth switching elements being turned on and off according to third and fourth control signals, respectively; one of the first and third switching elements is turned on according to the first and third control signals in accordance with the detection result of the first detecting means; and both of the second and fourth switching elements are turned on according to the second and fourth control signals for a time period over which voltage is applied to the predetermined node.

Preferably, according to a third aspect of the present invention, the voltage applying means includes a first switching element having a first terminal receiving the first voltage, a second terminal connected to the predetermined node, and a control terminal, the first switching element being turned on and off in response to a first control signal at its control terminal, and a second switching element having a first terminal receiving the second voltage, a second terminal connected to the predetermined node, and a control terminal, the second switching element being turned on and off in response to a second control signal at its control terminal, the applied voltage removing means outputting third and fourth control signals indicative of time periods over which the first and second switching elements are capable of being on, respectively, the first detecting means outputting a fifth control signal which permits one of the first and second switching elements to be turned on according to the logical value of the predetermined node, the first control signal being produced by a logic operation of the third and fifth control signals, the second control signal being produced by a logic operation of the fourth and fifth control signals.

Preferably, according to a fourth aspect of the present invention, the first and second detecting means include buffer means having an input terminal connected to the predetermined node, and an output terminal for outputting a signal having the same logical value as a signal applied to the input terminal, and a switching element having an input terminal connected to the output terminal of the buffer means, an output terminal, and a control terminal receiving a switching signal; and the switching element is placed into a non-conducting state by the switching signal before the voltage applying means starts applying voltage to the predetermined node, to output the detection result of the second detecting means at the input terminal of the switching element, and to output the detection result of the first detecting means at the output terminal of the switching element.

Preferably, according to a fifth aspect of the present invention, the high impedance detecting circuit further comprises: opening and closing means between the predetermined node and the predetermined logic circuit, the opening and closing means electrically disconnecting the output of the predetermined logic circuit from the predetermined node before the voltage applying means starts applying voltage to the predetermined node, the opening and closing means electrically connecting the predetermined logic circuit to the predetermined node after the applied voltage removing means removes the applied voltage.

Preferably, according to a sixth aspect of the present invention, the predetermined logic circuit includes an output circuit connected to the predetermined node for providing an output which is at the high impedance by the switching signal; and the voltage applying means applies voltage to the predetermined node in response to the switching signal when the output of the output circuit is at the high impedance.

A seventh aspect of the present invention is intended for an interface circuit between a first circuit and a second circuit for transmitting therethrough a digital signal from the first circuit to the second circuit. According to the present invention, the interface circuit comprises: connector means for connecting the first circuit; and a high impedance detecting circuit for detecting whether or not the connector means is at a high impedance which is an impedance when the connector means is open to provide information to the second circuit.

Preferably, according to an eighth aspect of the present invention, the interface circuit further comprises: a judging circuit for judging whether or not the connector means is in use during a predetermined time period on the basis of the detection result of the high impedance detecting circuit to provide information about the judgement result to the second circuit, the judging circuit making the judgement again upon receipt of a reset signal to provide information about the judgment result to the second circuit.

Preferably, according to a ninth aspect of the present invention, the interface circuit further comprises: a judging circuit for judging whether or not the connector means is in use on the basis of the detection result of the high impedance detecting circuit to provide information about the judgment result to the second circuit, the high impedance detecting circuit and the judging circuit being designed to constantly monitor the high impedance of the connector means.

According to a tenth aspect of the present invention, an interface circuit comprises: connector means receiving a voltage at an intermediate level which is neither high nor low logic level when not in use for connecting a predetermined circuit; a differential amplifier circuit between the connector means and the predetermined circuit and having a first input connected to the connector means and a second input receiving the voltage having the intermediate level; an intermediate voltage detecting circuit for detecting whether or not a voltage of the connector means is at the intermediate level; and a judging circuit for judging whether or not the connector means is in use on the basis of the detection result of the intermediate voltage detecting means to provide information about the judgement result to the predetermined circuit, the differential amplifier circuit being on/off controlled on the basis of the judgment result of the judging circuit.

Preferably, according to an eleventh aspect of the present invention, the judging circuit judges that the connector means is in use when receiving the detection result indicative of the detection of the voltage having the intermediate level from the intermediate voltage detecting circuit over a predetermined time period of at least two cycles of a clock providing a timing of changes in output of the predetermined circuit.

In accordance with the high impedance detecting circuit of the first aspect of the present invention, as above described, the first and second detecting means detect the voltage of the predetermined node before the voltage applying means applies the voltage and after the applied voltage is removed, and the judging means judges the difference between the results of the detection, thereby detecting whether or not the logical value provided by the voltage applied by the voltage applying means is driven again by the predetermined logic circuit and changes to a different logical value. Thus, the determination may be made as to whether or not the predetermined node is at the high impedance.

In accordance with the high impedance detecting circuit of the second aspect of the present invention, the first and third switching elements determine which one of the first and second voltages is applied to the predetermined node, and the second and fourth switching elements connected in series with the first and third switching elements, respectively, are on over the time period of voltage application. This provides the high impedance detecting circuit which is simple in structure and which may apply voltage and remove the applied voltage at high speeds.

In accordance with the high impedance detecting circuit of the third aspect of the present invention, the first and second switching elements provide the first and second voltages to the predetermined node, and the control signal directs the first and second switching elements to apply voltage to the predetermined node and to remove the applied voltage. This provides the high impedance detecting circuit which is simple in structure and which may apply voltage and remove the applied voltage at high speeds.

In accordance with the fourth aspect of the present invention, while the switching element is off, the signal held by the output terminal of the switching element is used as the output from the first detecting means, and the output from the buffer means is used as the output from the second detecting means. This simplifies the structure.

In accordance with the high impedance detecting circuit of the fifth aspect of the present invention, the opening and closing means electrically disconnects the output of the predetermined logic circuit from the predetermined node when voltage is applied to the predetermined node, preventing current from flowing into or out of the predetermined logic circuit. This reduces power consumption for high impedance detection. Also prevented is the increase in power consumption during the high impedance detection resulting from a capacitance between the predetermined logic circuit and the predetermined node.

In accordance with the high impedance detecting circuit of the sixth aspect of the present invention, the voltage applying means applies voltage to the predetermined node when the output from the predetermined logic circuit to the predetermined node is at the high impedance, preventing current from flowing into and out of the predetermined logic circuit. This reduces power consumption for high impedance detection.

In accordance with the interface circuit of the seventh aspect of the present invention, the high impedance detecting circuit detects the high impedance of the connector means connected to the first circuit to judge whether or not the first circuit is connected to the connector means.

In accordance with the interface circuit of the eighth aspect of the present invention, the reset signal is applied to the judging circuit to allow repetitive judgement, permitting the judgement that the connector means is not in use with desired timing.

In accordance with the interface circuit of the ninth aspect of the present invention, the high impedance detecting circuit and the judging circuit constantly monitor the high impedance of the connector means to detect the connector means driven by the first circuit.

In accordance with the interface circuit of the tenth aspect of the present invention, the judging circuit turns off the differential amplifier circuit when the predetermined circuit is not connected to the connector means and the connector means is at the intermediate voltage. This reduces power consumption of the interface circuit when the connector means is not in use.

In accordance with the interface circuit of the eleventh aspect of the present invention, when the judging circuit provides the detection result indicative of the detection of the intermediate voltage from the intermediate voltage detecting circuit over the predetermined time period, the determination is made that the connector means is in use. This reduces misjudgments.

It is therefore an object of the present invention to provide a High-Z detecting circuit in a digital circuit for detecting High-Z of a predetermined node.

It is another object of the present invention to provide an interface circuit which is capable of judging whether or not the input terminal is in use.

It is still another object of the present invention to control the operation of a differential amplifier circuit on the basis of the result of judgement of the interface circuit to reduce power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram of a specific form of the high impedance detecting circuit of FIG. 1;

FIGS. 4A to 4E are a timing chart illustrating the operation of the high impedance detecting circuit of FIG. 3;

FIGS. 5A to 5E are a timing chart illustrating the operation of the high impedance detecting circuit of FIG. 3;

FIG. 6 is a block diagram of another specific from of the high impedance detecting circuit of FIG. 1;

FIGS. 7A to 7C are a timing chart illustrating the high impedance detecting circuit of FIG. 6;

FIGS. 8A to 8C are a timing chart illustrating the high impedance detecting circuit of FIG. 6;

FIGS. 11A to 11E are a timing chart illustrating the operation of the high impedance detecting circuit of FIG. 10;

FIGS. 12A to 12E are a timing chart illustrating the operation of the high impedance detecting circuit of FIG. 10;

FIGS. 15A to 15C are a timing chart illustrating the operation of the circuit of FIG. 14;

FIGS. 16A to 16D are a timing chart illustrating the operation of the high impedance detecting circuit of FIG. 13;

FIGS. 17A to 17D are a timing chart illustrating the operation of the high impedance detecting circuit of FIG. 13;

FIG. 18 conceptually illustrates the high impedance detecting circuit according to a third preferred embodiment of the present invention;

FIG. 19 is a circuit diagram of the tri-state buffer at the output stage of the logic circuit shown in FIG. 18;

FIGS. 20A to 20D are a timing chart illustrating the operation of the high impedance detecting circuit of FIG. 18;

FIGS. 21A to 21D are a timing chart illustrating the operation of the high impedance detecting circuit of FIG. 18;

FIG. 22 is a block diagram of an interface circuit according to a fourth preferred embodiment of the present invention;

FIG. 29 is a circuit diagram of the judging circuit shown in FIG. 27;

FIGS. 30A to 30E are a timing chart illustrating the operation of the judging circuit of FIG. 29;

FIG. 33 is a circuit diagram of a conventional interface circuit;

FIGS. 34A and 34B are waveform charts of input and output signals of the circuit of FIG. 33;

DESCRIPTION OF THE PREFERRED EMBODIMENTS

First Preferred Embodiment

Figure 1:
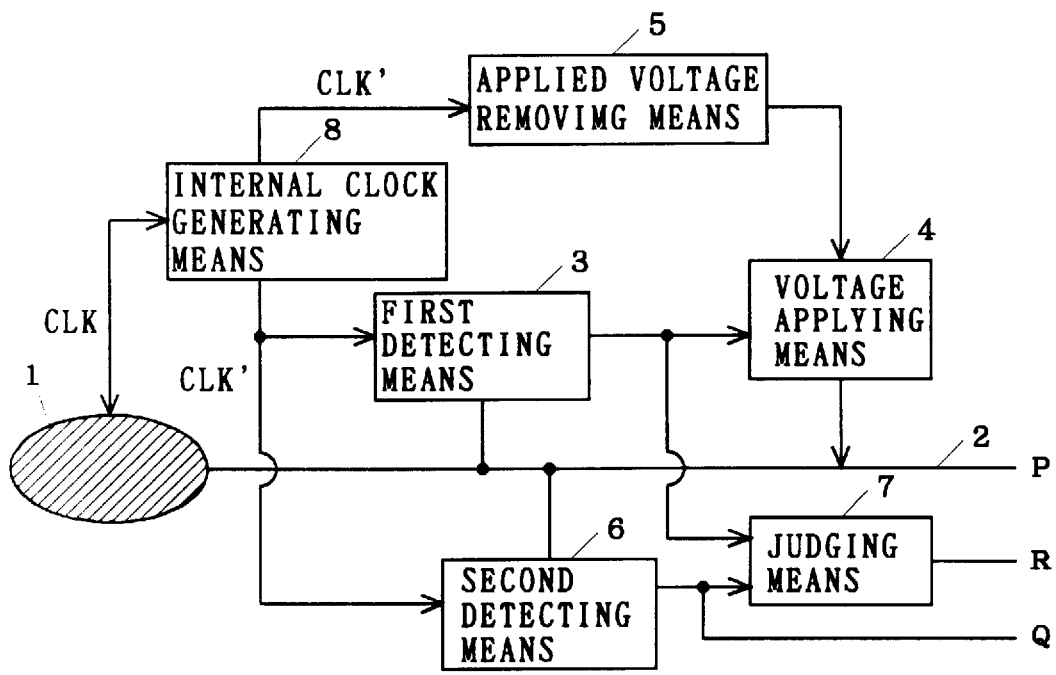
FIG. 1 conceptually illustrates a high impedance detecting circuit according to a first preferred embodiment of the present invention.

With reference to FIGS. 1 through 8C, a High-Z detecting circuit according to a first preferred embodiment of the present invention will be described below. FIG. 1 conceptually illustrates the High-Z detecting circuit according to the first preferred embodiment of the present invention. The High-Z detecting circuit is provided in a digital circuit.

In FIG. 1, the reference numeral 1 designates a logic circuit provided, for example, in a digital circuit; 2 designates a node driven by the logic circuit 1; 3 designates a first detecting means for detecting a logical value at the node 2 during a time period over which the signal value at the node 2 is held; 4 designates a voltage applying means for applying one of a power supply voltage Vdd and a ground voltage GND which has a logical value opposite to the result of detection by the first detecting means 3; 5 designates an applied voltage removing means for removing the voltage applied by the voltage applying means 4 to the node 2 to enable the state of the node 2 to drive the logic circuit 1 again; 6 designates a second detecting means for detecting the logical value at the node 2 after the removal of the applied voltage; 7 designates a judging means for judging High-Z on the basis of the results of detection by the first and second detecting means 3 and 6; and 8 designates an internal clock generating means for generating a clock CLK' for operating the High-Z detecting circuit from a clock CLK fed to the logic circuit 1.

In the High-Z detecting circuit shown in FIG. 1, the internal clock CLK' is fed to the first and second detecting means 3, 6 and the applied voltage removing means 5. However, the arrangement of the High-Z detecting circuit is not limited to such a structure. The internal clock CLK' may be fed to any means as far as the means 1 to 7 constituting the High-Z detecting circuit appropriately operate in accordance with changes in output signal from the logic circuit 1.

Each of the means 3 to 7 may determine the operating timing thereof on the basis of the operating timing of any other means, and the arrangement for determining the timing which permits High-Z detection is not limited to that of FIG. 1.

Figure 2:
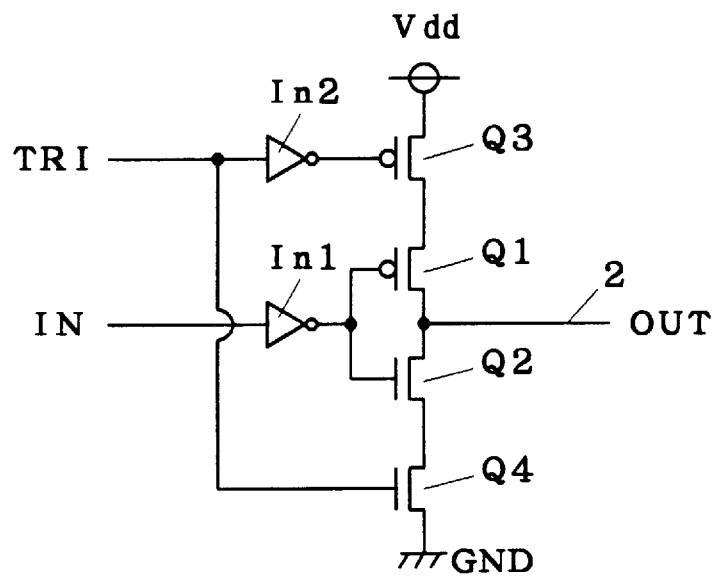
FIG. 2 is a circuit diagram of a tri-state buffer at the output stage of a logic circuit shown in FIG. 1.

FIG. 2 is a circuit diagram of a tri-state buffer for driving the node 2 provided at the output stage of the logic circuit 1. Transistors Q1 and Q2 shown in FIG. 2 constitute a CMOS inverter receiving the power supply voltage Vdd and ground voltage GND to operate. The output terminal of an inverter In1 is connected to the gates of the transistors Q1 and Q2. The power supply voltage Vdd is applied to the source of the transistor Q1 through a transistor Q3, and the inverted signal of a control signal TRI is applied to the gate of the transistor Q3 from an inverter In2. The ground voltage GND is applied to the source of the transistor Q2 through a transistor Q4, and the control signal TRI is applied to the gate of the transistor Q4.

When the control signal TRI is "H," the node 2 is connected to a power supply by the tri-state buffer of FIG. 2 or grounded. Then, a signal OUT provided to the node 2 has the same logical value as a signal IN applied to the input terminal of the inverter In1.

FIG. 3 is a circuit diagram of a specific form of the High-Z detecting circuit of FIG. 1. In FIG. 3, the reference numeral 10 designates a voltage detecting means having the function of both of the first and second detecting means 3 and 6 of FIG. 1. Other reference numerals designate elements corresponding to those of FIG. 1. The internal clock generating means 8 of FIG. 1 is not shown in FIG. 3. The internal clock CLK', or a signal N, may be readily generated by multiplying the clock CLK, for example.

The voltage detecting means 10 includes a buffer Bu1 having an input terminal connected to the node 2 and an output terminal for outputting a signal obtained by amplifying a signal value at the input terminal, a transfer gate Tr1 connected to the output terminal of the buffer Bu1, and an inverter In3 for applying the inverted signal $\overline{N}$ to the transfer gate Tr1. The transfer gate Tr1 is conducting while the signal N is "H," and transmits the voltage at its input terminal from the output terminal of the buffer Bu1 to the output terminal of the transfer gate Tr1. Since the voltage at the node 2 has either logical value, the buffer Bu1 buffers a signal P at the node 2 and amplifies the voltage to set the input terminal of the transfer gate Tr1 to the power supply voltage Vdd or the ground voltage GND. The output from the buffer Bu1 corresponds to the output from the second detecting circuit, and the output from the transfer gate Tr1 corresponds to the output from the first detecting circuit. This simplifies the arrangement.

The voltage applying means 4 includes a P-channel MOS transistor Q5 having a drain, a gate connected to the output terminal of the transfer gate Tr1, and a source receiving the power supply voltage Vdd, and an N-channel MOS transistor Q6 having a drain, a gate connected to the output terminal of the transfer gate Tr1, and a source receiving the ground voltage GND.

The applied voltage removing means 5 includes a delay element De1 for delaying the clock CLK' by a time interval dt1; a delay element De2 for delaying the clock CLK' delayed by the delay element De1 further by a time interval dt2; an inverter In4 for inverting the output from the delay element De2; a NOR gate Nor1 for outputting the NOR of the output from the inverter In4 and the output from the delay element De1; an inverter In5 for inverting the output from the NOR gate Nor1; a P-channel MOS transistor Q7 having a source connected to the drain of the transistor Q5, a drain connected to the node 2, and a gate receiving an output signal $\overline{M}$ from the inverter In5; and an N-channel MOS transistor Q8 having a source connected to the drain of the transistor Q6, a drain connected to the node 2, and a gate receiving an output signal M from the NOR gate Nor1.

The judging means 7 includes an XOR gate Ex1 for outputting the exclusive-OR of the output from the buffer Bu1 and the signal transmitted by the transfer gate Tr1.

As above described, the transistors Q5 and Q7 connected in series between the node providing the power supply voltage Vdd and the node 2, and the transistors Q6 and Q8 connected in series between the node providing the ground voltage GND and the node 2 are used to apply voltage and remove the applied voltage. This permits the simple arrangement and high-speed operation of the High-Z detecting circuit.

The operation of the High-Z detecting circuit of FIG. 3 is described below with reference to the timing charts of FIGS. 4A–4E and FIGS. 5A–5E. The signal N shown in FIGS. 4A and 5A is the clock CLK'. The signal M shown in FIGS. 4B and 5B is the output from the NOR gate Nor1. The signal R shown in FIGS. 4E and 5E is an output signal from the XOR gate Ex1. The signal Q shown in FIGS. 4C and 5C is a signal transmitted by the transfer gate Tr1. The signal P shown in FIGS. 4D and 5D is a signal transmitted to the node 2.

A time period t0 is the first time period over which the signal at the node 2 is stable after the node 2 is driven by the logic circuit 1. During the time period t0, if the node 2 is at High-Z, a leak current causes the node 2 to have the value "H" or "L." At this time, since the signal is "H," the output terminal of the transfer gate Tr1 receives charges from the buffer Bu1 so as to reach the power supply voltage Vdd or the ground voltage GND depending upon the logical value of the node 2. The transistors Q7 and Q8 are off during the time period t0 since the signal M is "L."

Time periods t1 to t3 which follow the time period t0 are those over which the signal at the node 2 is stable. If the signal N changes from "H" to "L" during the time period t1, the transfer gate Tr1 becomes non-conducting, and the value of the signal Q during the time period t0 is held. That is, the signal Q during the time periods t1 and t2 is the result of detection of the logical value of the node 2 by the first detecting means. The output terminal of the transfer gate Tr1 has a parasitic capacitance, and the voltage thereof is held.

One of the transistors Q5 and Q6 constituting the voltage applying means 4 is on accordint to the signal Q. Specifically, the transistor Q5 is on if the signal P is "L" during the time period t0 as shown in FIGS. 4A to 4E, and the transistor Q6 is on if the signal P is "H" as shown in FIGS. 5A to 5E.

The delay element De1 causes the transition of the signal M from "L" to "H" to lag by the time interval dt1 behind the transition of the signal N from "H" to "L". Thus, the transistors Q7 and Q8 turn on. In other words, the applied voltage removing means 5 permits the voltage applying means 4 to apply voltage to the node 2 at this time.

The signal M changes from "H" to "L" after the time dt2 has elapsed since the signal M changed to "H," that is, at the end of the time period t1 (start of the time period t2). This change turns off the transistors Q7 and Q8. That is, the applied voltage removing means 5 removes the applied voltage by the voltage applying means 4.

The removal of the applied voltage causes the logic circuit 1 to drive the node 2 again. Thus, if the logic circuit 1 does not cause the node 2 to be at High-Z, the logical value of the node 2 returns to that during the time period t0.

After a time required for the logic circuit 1 to drive the node 2 has elapsed since the start of the time period t2, the buffer Bu1 outputs the result of detection as the second detecting means. The exclusive-OR of the output from the buffer Bu1 and the signal Q which is provided from the XOR gate Ex1 becomes the result of High-Z judgement by the judging means 7. If the signal R is "H," it is understood that the logic circuit 1 is in the state which causes the node 2 to be at High-Z. If the signal R is "L," the value of the signal Q is judged as the output from the logic circuit 1 as it is.

During the time period t3, the signal N changes to "L" to cause the transfer gate Tr1 to conduct.

It will be appreciated from no changes in the signal Q during the time periods t0 to t2 that the provision of the above described High-Z detecting circuit enables the detection of High-Z from the logic circuit 1 in the digital circuit without influence of the voltage applied to the node 2 for High-Z detection upon the circuit at the succeeding stage of the logic circuit 1.

In the above description of the first preferred embodiment, the driving capability of the High-Z detecting circuit is greater than that of the logic circuit 1, and the voltage applying means 4 changes the logical value of the node 2. However, the judgement may be made if the driving capability of the logic circuit 1 is greater, without influences upon the result of the judgment.

FIG. 6 is a block diagram of another specific form of the High-Z detecting circuit of FIG. 1. In FIG. 6, the reference numeral 15 designates a checking and judging block for checking and judging the state of the node 2; the reference character Q9 designates a P-channel MOS transistor having a source receiving the power supply voltage Vdd, a drain connected to the node 2, and a gate receiving a control signal SC1 from the checking and judging block 15 and on-off controlled in response to the control signal SC1; and Q10 designates an N-channel MOS transistor having a source receiving the ground voltage GND, a drain connected to the node 2, and a gate receiving a control signal SC2 from the checking and judging block 15 and on-off controlled in response to the control signal SC2.

The checking and judging block 15 is substantially similar in construction to the High-Z detecting circuit of FIG. 3. Specifically, the checking and judging block 15 is constructed such that the transistors Q5 to Q8 are removed from the High-Z detecting circuit of FIG. 3 and the logical product of the signal Q and the signal $\overline{M}$ and the logical product of the signal Q and the signal M are used as the control signal SC1 and the control signal SC2, respectively. The checking and judging block 15 of FIG. 6 further comprises two 2-input AND gates 16 and 17.

In this manner, the transistor Q9 between the node providing the power supply voltage Vdd and the node 2 and the transistor Q10 between the node providing the ground voltage GND and the node 2 are used to apply voltage and remove the applied voltage. This permits the simple structure and high-speed operation of the High-Z detecting circuit.

The evaluating CMOS transistors Q9 and Q10 are connected as shown and subjected to the process to be described below, permitting the detection of "H," "L," or High-Z at the node 2. The process of the check and judgment is described below with reference to FIGS. 7A–7C and FIGS. 8A–8C. The signal SC1 shown in FIGS. 7A and 8A is the signal applied to the gate of the transistor Q9. The signal SC2 shown in FIGS. 7B and 8B is the signal applied to the gate of the transistor Q10. The signal P is the output from the logic circuit 1 of FIG. 6.

(1) During a time period t10, the checking and judging block 15 detects the logical value of the signal P at the node 2. This detection is similar to the detection by the High-Z detecting circuit of FIG. 3, and the description thereof will be dispensed with.

(2) During a time period t11, the checking and judging block 15 controls the transistors Q9 and Q10 to apply the voltage which provides the logical value opposite to the signal P during the time period t10 to the node 2. Specifically, the checking and judging block 15 changes the control signal SC1 to 'L' as shown in FIG. 7A to turn on the transistor Q9 during the time period t11 if the signal P is "L" during the time period t10. The checking and judging block 15 changes the control signal SC2 to "H" as shown in FIG. 8B to turn on the transistor Q10 during the time period t11 if the signal P is "H" during the time period t10.

(3) During a time period t12, the checking and judging block 15 directs the transistors Q9 and Q10 to remove the voltage applied during the time period t11. Specifically, during the time period t12, the checking and judging block 15 changes the control signal SC1 to "H" to turn off the transistor Q9 and changes the control signal SC2 to "L" to turn off the transistor Q10.

(4) The output from the logic circuit 1 is judged as High-Z if the logical value of the signal P during the time period t13 differs from the logical value of the signal P during the time period t10. Conversely, the output signal from the logic circuit 1 is judged as being equal to the signal P if the logical value of the signal P during the time period t13 equals the logical value of the signal P during the time period t10.

In the description of the first preferred embodiment, a comparison is made between the logical values of the signal P during the time periods t0 and t2 or between the logical values of the signal P during the time periods t10 and t13. However, if the driving capability of the High-Z detecting circuit is less than that of the logic circuit 1, the comparison may be made between the logical values during the time periods t0 and t1 or between the logical values during the time periods t10 and t11 to detect whether or not driving the High-Z detecting circuit has changed the logical value, thereby judging High-Z.

It should be noted that the High-Z detecting circuit of FIG. 6 is adapted to remove the applied voltage in response to the signal M from the applied voltage removing means 5.

Second Preferred Embodiment

In the High-Z detecting circuit of the first preferred embodiment, a short circuit current flows during about the time period t1 of FIGS. 4A–4E and 5A–5E or the time period t11 of FIGS. 7A–7C and 8A–8C, increasing power consumption for High-Z detection. If the wiring capacitance and the capacitance of the output gate of the logic circuit 1 are high, current flows for charging and discharging during voltage application for judgement, increasing power consumption. Further, it is necessary in some cases to adjust the relationship between the driving capability of the logic circuit 1 and the driving capability of the evaluating transistors Q5 to Q10.

The High-Z detecting circuit according to a second preferred embodiment is constructed to solve the above described problems. The High-Z detecting circuit according to the second preferred embodiment of the present invention will be described below with reference to FIGS. 9 through 17D.

Figure 9:
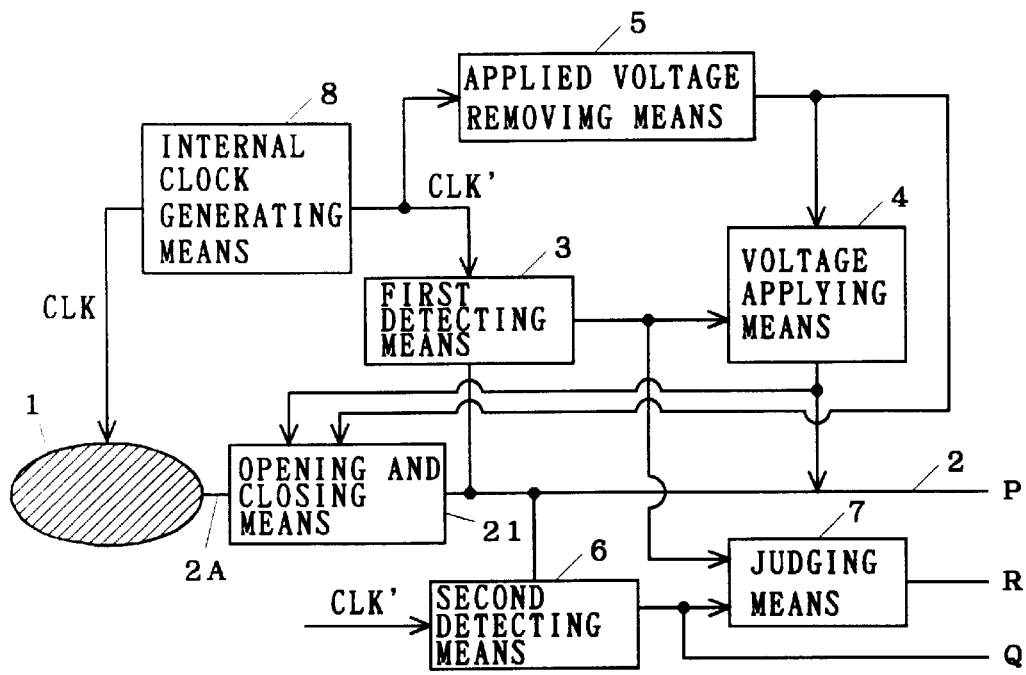
FIG. 9 conceptually illustrates the high impedance detecting circuit according to a second preferred embodiment of the present invention.

FIG. 9 conceptually illustrates the High-Z detecting circuit according to the second preferred embodiment of the present invention. The High-Z detecting circuit is provided in a digital circuit.

In FIG. 9, the reference numeral 21 designates an opening and closing means for disconnecting an output 2A of the logic circuit 1 from the node 2 during a time period over which the voltage applying means 4 applies voltage. Other reference numerals and characters designate elements corresponding to those of FIG. 1.

The opening and closing means 21 which is required to operate with voltage application timing and applied voltage removal timing is adapted to directly receive information about the voltage application timing from the voltage applying means 4 and information about the applied voltage removal timing from the applied voltage removing means 5 in the High-Z detecting circuit of FIG. 9. Additionally, the opening and closing means 21 may be constructed to indirectly obtain these timings, and is not limited to the arrangement of FIG. 9.

Figure 10:
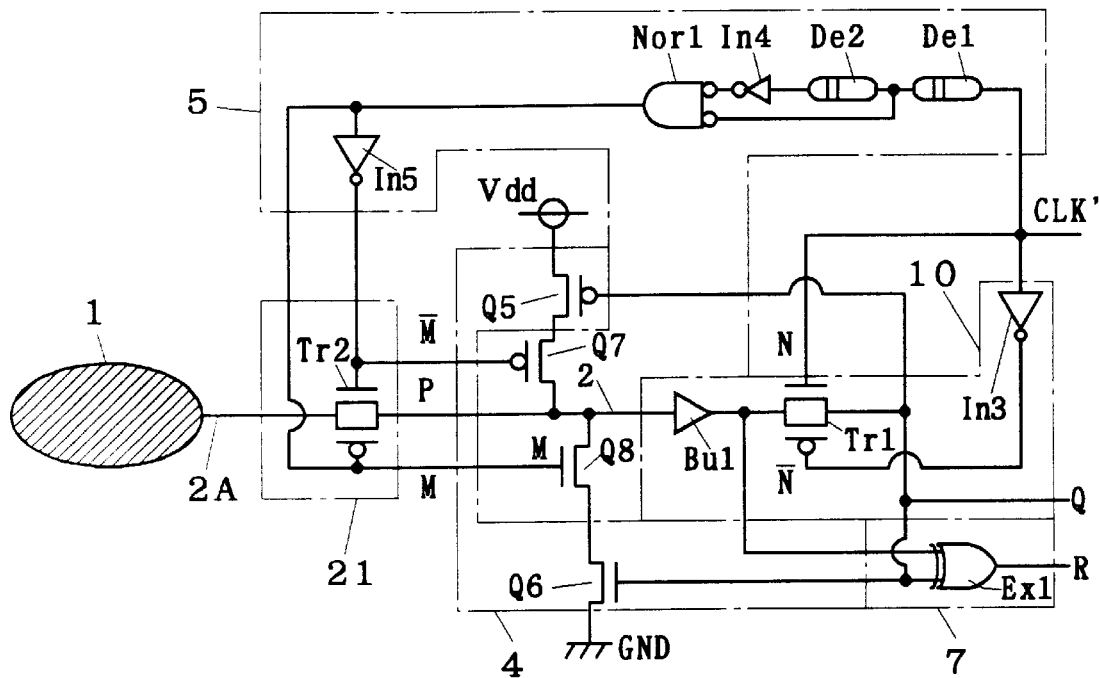
FIG. 10 is a circuit diagram of a specific form of the high impedance detecting circuit of FIG. 9.

FIG. 10 is a circuit diagram of a specific form of the High-Z detecting circuit of FIG. 9. The High-Z detecting circuit of FIG. 10 differs from the High-Z detecting circuit of FIG. 3 in that it further comprises the opening and closing means 21. The opening and closing means 21 includes an input terminal connected to the output terminal 2A of the logic circuit 1, an output terminal connected to the node 2, and a transfer gate Tr2 controlled by the signal M and the inverted signal $\overline{M}$.

FIGS. 11A–11E and 12A–12E are timing charts showing the operation of the High-Z detecting circuit of FIG. 10. The signal N shown in FIGS. 11A and 12A is the clock CLK'. The signal M shown in FIGS. 11B and 12B is the output from the NOR gate Nor1. The signal Q shown in FIGS. 11C and 12C is the signal transmitted by the transfer gate Tr1. The signal P shown in FIGS. 11D and 12D is the signal transmitted to the node 2. The signal R shown in FIGS. 11E and 12E is the output signal from the XOR gate Ex1. It will be apparent from the comparison between FIGS. 4A–4E, 5A–5E and FIGS. 11A–11E, 12A–12E that the relative changes of the signals M, N, P, Q, and R during time periods t20 to t23 are identical to those during the time periods t0 to t3, respectively. The operation of the High-Z detecting circuit of FIG. 10 differs from the operation of the High-Z detecting circuit of FIG. 3 in that the transfer gate Tr2 of the High-Z detecting circuit of FIG. 10 is non-conducting while the signal M is "H" during the time period t21.

The transistors Q7 and Q8 are on while the signal M is "H." During this time period, the output 2A of the logic circuit 1 may be disconnected from the node 2 to reduce power consumption. Since the opening and closing means 21 is located adjacent the High-Z detecting circuit, the High-Z detection may be achieved with low power consumption independently of the arrangement of the logic circuit 1.

Figure 13:
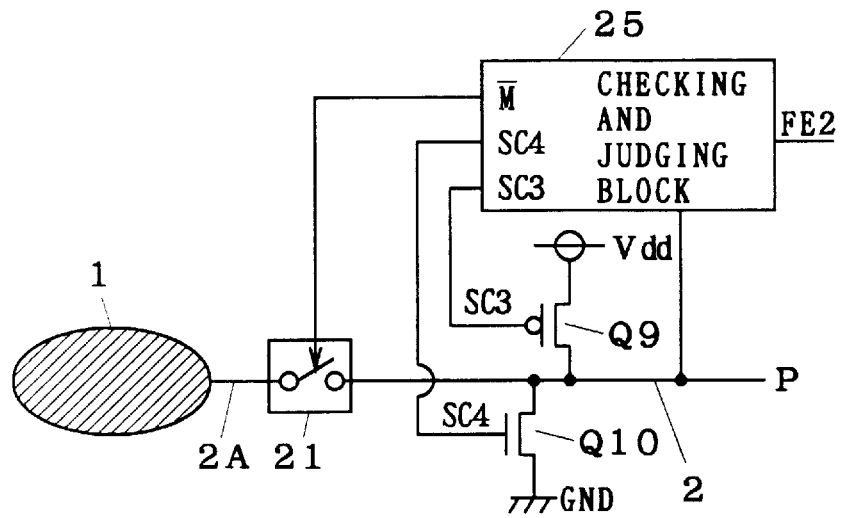
FIG. 13 is a circuit diagram of another specific form of the high impedance detecting circuit of FIG. 9.

FIG. 13 is a block diagram of another specific form of the High-Z detecting circuit of FIG. 9. In FIG. 13, the reference numeral 21 designates an opening and closing means for controlling connection/disconnection between the output 2A of the logic circuit 1 and the node 2; 25 designates a checking and judging block for checking and judging the state of the node 2; the reference character Q9 designates a P-channel MOS transistor having a source receiving the power supply voltage Vdd, a drain connected to the node 2, and a gate receiving a control signal SC3 from the checking and judging block 25, and on-off controlled in response to the control signal SC3; and Q10 designates an N-channel MOS transistor having a source receiving the ground voltage GND, a drain connected to the node 2, and a gate receiving a control signal SC4 from the checking and judging block 25, and on-off controlled in response to the control signal SC4.

The opening and closing means 21 of FIG. 13 includes the transfer gate Tr2 shown in FIG. 10, for example.

The checking and judging block 25 is substantially similar in construction to the checking and judging block 15 except that the checking and judging block 25 includes portions for generating the control signals SC3 and SC4.

Figure 14:
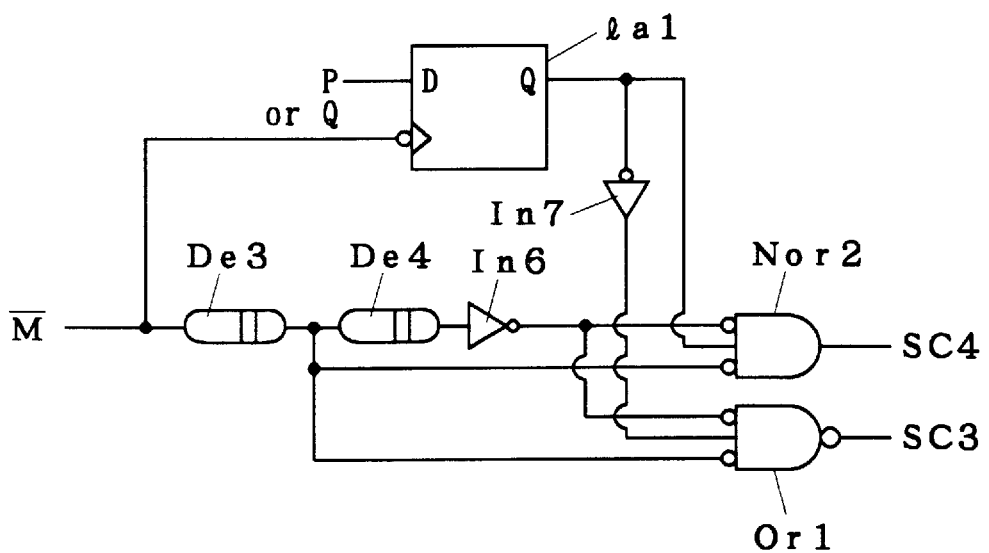
FIG. 14 is a circuit diagram of a portion for producing control signals SC3 and SC4.

FIG. 14 is a circuit diagram of the portions of the checking and judging block 25 for generating the control signals SC3 and SC4. In FIG. 14, the reference character la1 designates a D-latch for latching the logical value of the signal P or Q during the last transition of the signal $\overline{M}$; In7 designates an inverter for inverting the output from the D-latch la1; De3 designates a delay element for delaying the signal $\overline{M}$ by a time interval dt3; De4 designates a delay element for delaying the output from the delay element De3 further by a time interval dt4; In6 designates an inverter for inverting the output from the delay element De4; Nor2 designates a 3-input NOR gate for providing the signal SC4 which is the NOR of the inversion of the Q output from the D-latch la1, the output from the inverter In6, and the output from the delay element De3; and Or1 designates a 3-input OR gate for providing the signal SC3 which is the OR of the Q output from the D-latch la1, the output from the inverter In7, and the output from the delay element De3.

FIGS. 15A to 15C are a timing chart showing the relation between the signal $\overline{M}$ and the control signals SC3 and SC4 generated by the circuit of FIG. 14. The signal $\overline{M}$ shown in FIG. 15A is the signal for controlling the opening and closing of the opening and closing means 21 of FIG. 13. The signal SC3 shown in FIG. 15B is the signal applied to the gate of the transistor Q9 of FIG. 13. The signal SC4 shown in FIG. 15C is the signal applied to the gate of the transistor Q10 of FIG. 13. When the signal applied to the D-input of the D-latch is "L" during the last transition of the signal $\overline{M}$, the control signal SC3 falls after the time dt3 has elapsed since the last transition of the signal $\overline{M}$, and rises after the time dt4 has elapsed since the falling edge thereof. When the signal applied to the D-input of the D-latch is "H" during the last transition of the signal $\overline{M}$, the control signal SC4 rises after the time dt3 has elapsed since the last transition of the signal $\overline{M}$, and falls after the time dt4 has elapsed since the rising edge thereof.

The checking and judging process in the High-Z detecting circuit of FIG. 13 will be described below with reference to FIGS. 16A–16D and FIGS. 17A–17D. The signal SC3 shown in FIGS. 16A and 17A is the signal applied to the gate of the transistor Q9 of FIG. 13. The signal SC4 shown in FIGS. 16B and 17B is the signal applied to the gate of the transistor Q10 of FIG. 13. The signal P shown in FIGS. 16C and 17C is the output signal from the logic circuit 1 of FIG. 13. The signal $\overline{M}$ shown in FIGS. 16D and 17D is the signal for controlling the opening and closing of the opening and closing means 21 of FIG. 13.

(1) During a time period t30, the checking and judging block 25 detects the logical value of the signal P at the node 2. This detection is identical with the detection by the High-Z detecting circuit of FIG. 3, and the description thereof will be dispensed with.

(2) During a time period t31, the checking and judging block 25 controls the transistors Q9 and Q10 to apply the voltage which provides the logical value opposite to the signal P during the time period t30 to the node 2. Specifically, the checking and judging block 25 changes the control signal SC3 to "L" as shown in FIG. 16A to turn on the transistor Q9 during the time period t31 if the logical value of the signal P is "L" during the time period t30. The checking and judging block 25 changes the control signal SC4 to "H" as shown in FIG. 17B to turn on the transistor Q10 during the time period t31 if the logical value of the signal P is "H" during the time period t30.

(3) During a time period t32, the checking and judging block 25 directs the transistors Q9 and Q10 to remove the voltage applied during the time period t31. Specifically, during the time period t32, the checking and judging block 25 changes the signal $\overline{M}$ to "H" to turn off the transistors Q9 and Q10.

(4) The output from the logic circuit 1 is judged as High-Z if the logical value of the signal P during the time period t33 differs from the logical value of the signal P during the time period t30. Conversely, the output signal from the logic circuit 1 is judged as being equal to the signal P if the logical value of the signal P during the time period t33 equals to the logical value of the signal P during the time period t30.

It should be noted that the time period over which the control signal SC3 is "L" and the time period over which the control signal SC4 is "H" are designed to fall within the time period over which the signal $\overline{M}$ is "L." That is, the output terminal 2A of the logic circuit 1 is always disconnected from the node 2 during the time period over which the High-Z detecting circuit applies voltage to the node 2.

Third Preferred Embodiment

The High-Z detecting circuit of the second preferred embodiment comprises the opening and closing means.

However, if the logic circuit is capable of setting its output to High-Z by using a control signal from the exterior of the logic circuit, the opening and closing means may be dispensed with to reduce power consumption for High-Z detection. The High-Z detecting circuit having such a function according to a third preferred embodiment will be described below with reference to FIGS. 18 through 21D.

FIG. 18 is a block diagram of the High-Z detecting circuit according to the third preferred embodiment. In FIG. 18, the reference character 1A designates a logic circuit which is capable of setting the node 2 to High-Z by using a control signal SC7 from the exterior; 26 designates a checking and judging block for checking and judging the state of the node 2; Q9 designates a P-channel MOS transistor having a source receiving the power supply voltage Vdd, a drain connected to the node 2, and a gate receiving a control signal SC5 from the checking and judging block, and on-off controlled in response to the control signal SC5; and Q10 designates an N-channel MOS transistor having a source receiving the ground voltage GND, a drain connected to the node 2, and a gate receiving a control signal SC6 from the checking and judging block 26, and on-off controlled in response to the control signal SC6.

The checking and judging block 26 is similar in circuit construction to the checking and judging block 25 except that the checking and judging block 25 applies the signal $\overline{M}$ to the delay element De3 and D-latch la1 of FIG. 14 whereas the checking and judging block 26 applies the control signal SC7 to the delay element De3 and D-latch la1 of FIG. 14. The control signal SC7 is applied to the delay element De3 and D-latch la1 FIG. 14, thereby providing the control signal SC6 from the NOR gate Nor2 and the control signal SC5 from the OR gate Or1.

FIG. 19 is a circuit diagram of a tri-state buffer 27 provided at the output stage of the logic circuit 1A of FIG. 18 for driving the node 2. In FIG. 19, the reference character An4 designates an AND gate for providing the AND of the control signal SC7 and the control signal TRI to the input terminal of the inverter In2 and the gate of the transistor Q4. Other reference numerals and characters designate elements corresponding to those of FIG. 2.

The tri-state buffer 27 of FIG. 19 sets its output OUT to High-Z if the control signal SC7 is "L."

It will be apparent from the comparison between FIGS. 16A–16D, 17A–17D and FIGS. 20A–20D, 21A–21D that the operation is substantially similar except that the control signals SC3, SC4 and signal $\overline{M}$ are replaced with the control signals SC5, SC6 and SC7, respectively. The signal SC5 shown in FIGS. 20A and 21A is the signal applied to the gate of the transistor Q9 of FIG. 18. The signal SC6 shown in FIGS. 20B and 21B is the signal applied to the gate of the transistor Q10 of FIG. 18. The signal P shown in FIGS. 20C and 21C is the output signal from the logic circuit 1A. The signal SC7 shown in FIGS. 20D and 21D is the control signal provided from the exterior.

More specifically, in the High-Z detecting circuit of FIG. 13, the opening and closing means 21 disconnects the output 2A of the logic circuit 1 from the node 2 while the signal $\overline{M}$ is "L" during the time period t31, to forcefully change the logical value of the node 2. On the other hand, in the High-Z detecting circuit of FIG. 18, the logic circuit 1A outputs High-Z to facilitate the forceful change of the logical value of the node 2 while the control signal SC7 is "L" during the time period t41. This prevents current from flowing into and out of the tri-state buffer during the detection, reducing power consumption.

Fourth Preferred Embodiment

A fourth preferred embodiment according to the present invention will now be described with reference to FIG. 22. In the above-described preferred embodiments, the High-Z detecting circuit detects the output from the logic circuit provided in the digital circuit. However, the High-Z detecting circuit may be used not only to detect the three states: "H," "L," and High-Z but also to detect the presence/absence of High-Z. As shown in FIG. 22, the High-Z detecting circuit 35 may be provided at the interface with a device 30 including a predetermined circuit 33 formed therein and for transmitting a signal from an external circuit 31 connected to an input terminal 32 through an input buffer 34 to the predetermined circuit 33. An interface circuit IF1 includes the input terminal 32, the input buffer 34, and the High-Z detecting circuit 35.

The High-Z detecting circuit 35 may employ a High-Z detecting circuit having a construction other than that of the High-Z detecting circuit of the first and second preferred embodiments so far as it operates independently of the external circuit 31.

For CMOS input, a CMOS inverter having a threshold determined by the transistor size of the circuit is used for the input buffer 34. The input buffer 34 includes CMOS inverters In8 and In9 and is at High-Z when the input terminal 32 is not connected.

The High-Z detecting circuit 35 has a High-Z detecting terminal connected between the input terminal 32 and the input buffer 34 to detect whether the input terminal 32 is at High-Z or not. If the external circuit 31 having a low output impedance is not connected or if the external circuit 31 which is at High-Z when not in operation is connected and is not in use, the High-Z detecting circuit 35 detects High-Z to judge that the external circuit 31 is not connected to the input terminal 32 or is not in use. The High-Z detecting circuit is applicable to an input interface designed to be at High-Z when not in use as well as to the input buffer using CMOS inverters.

When a plurality of input terminals and input ports are provided, to know the input terminal and input port which is not connected to the external circuit 31 facilitates the handling and maintenance of the device. For example, when a new external circuit 31 is inserted, the device detects the new external circuit 31 to automatically allocate addresses to the port and input terminal connected to the new external circuit 31.

The High-Z detecting circuit of FIG. 3 or 10 may be used as the High-Z detecting circuit 35 to apply the signal Q to the input buffer 34, thereby achieving High-Z detection without influence of voltage changes in the connector 32 during the detection upon the input buffer 34.

The High-Z detecting circuit of FIG. 6 or 13 may be used as the High-Z detecting circuit 35, with the capability of the High-Z detecting circuit to drive the connector 32 being less than that of the external circuit 31, thereby achieving the High-Z detection while suppressing the voltage changes in the connector 32 during the detection.

Fifth Preferred Embodiment

Figure 23:
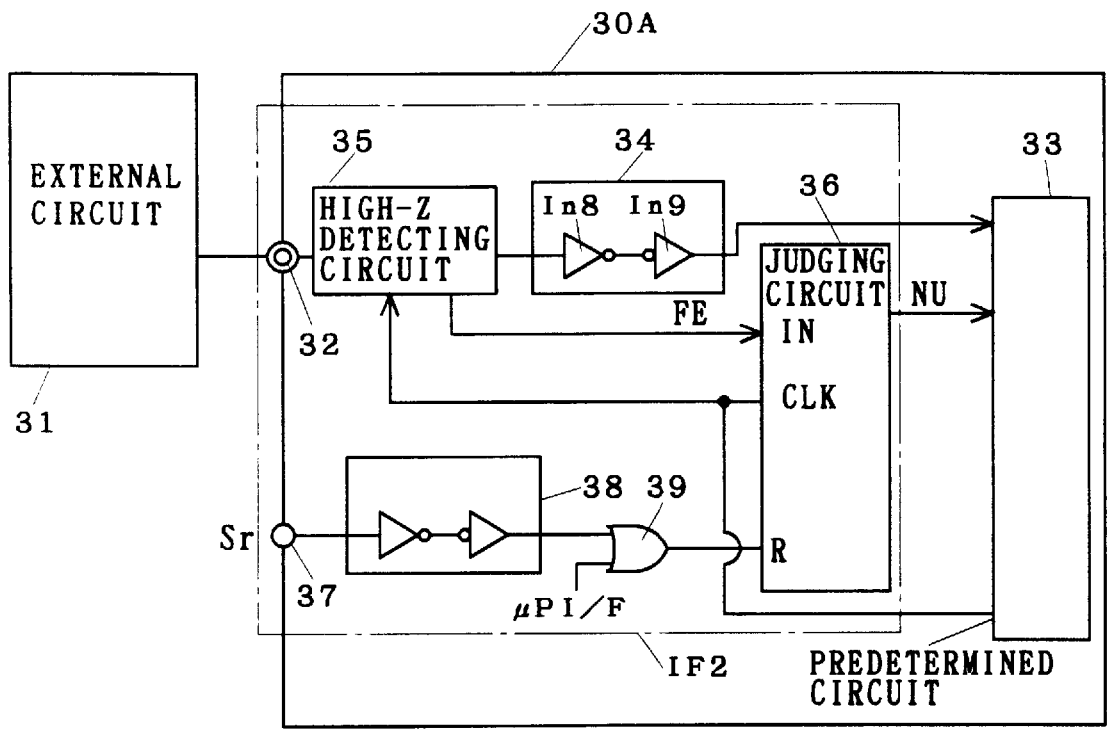
FIG. 23 is a block diagram of the interface circuit according to a fifth preferred embodiment of the present invention.

The interface circuit according to a fifth preferred embodiment of the present invention will be described below with reference to FIGS. 23 through 25D. FIG. 23 is a block diagram of the interface circuit according to the fifth preferred embodiment of the present invention. In FIG. 23, the reference numeral 36 designates a judging circuit for receiving a detection result FE from the High-Z detecting circuit 35 to judge whether or not the external circuit 31 is connected and to provide information about non-use to the predetermined circuit 33; 37 designates a terminal for receiving a reset signal Sr; 38 designates an input buffer for buffering the reset signal Sr; and 39 designates an OR gate for outputting the OR of the output from the input buffer 38 and a signal µPI/F from a microprocessor interface to the judging circuit 36. Other reference numerals and characters designate elements corresponding to those of FIG. 22. The input terminal 32, the input buffers 34, 38, the High-Z detecting circuit 35, the judging circuit 36, and the OR gate 39 constitute an interface circuit IF2.

The judging circuit 36 has a reset input R and may be initialized by the reset signal Sr from the exterior of a device 30A and the signal µPI/F from the inside thereof. When the external circuit 31 is connected later, the input interface circuit IF2 may be initialized after the connection to judge the presence/absence of the circuit which is connected to the input terminal 32 at the time of initialization. For example, a switch attached to the device 30A or software for controlling the microprocessor is used to reset the judging circuit 36, permitting the predetermined circuit 33 to explicitly recognize system changes.

Figure 24:
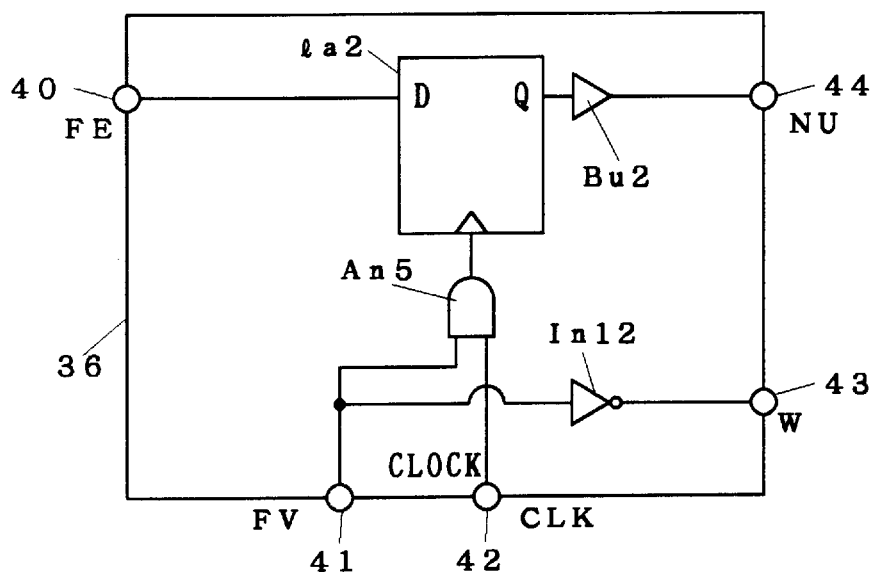
FIG. 24 is a circuit diagram of a judging circuit shown in FIG. 23.

FIG. 24 is a logic diagram of an arrangement of the judging circuit 35 shown in FIG. 23. In FIG. 24, the reference character An5 designates an AND gate for outputting the AND of a detection enabling signal FV and the clock CLK; la2 designates a D-latch for holding the detection result FE of the High-Z detecting circuit 35 from a terminal 40 at the rising edge of the output from the AND gate AnS; Bu2 designates a buffer for buffering the Q output from the D latch la2 to provide a non-use information signal NU at a terminal 44; and In12 designates an inverter for providing the inverted signal W of the detection enabling signal FV at a terminal 43.

Figure 25A:
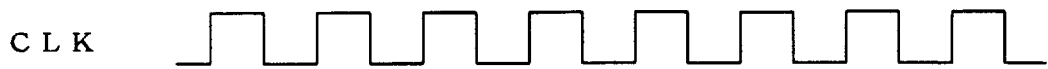
FIGS. 25A to 25D are a timing chart illustrating the operation of the judging circuit of FIG. 24.
Figure 25B:
Figure 25C:
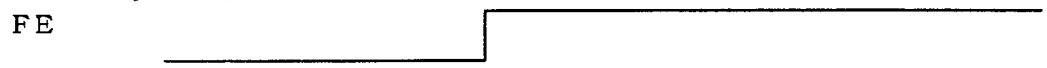
Figure 25D:

The detection result FE of the High-Z detecting circuit 35 of FIG. 23 is applied to the terminal 40. The OR gate 39 of FIG. 23 is connected to a terminal 41. The clock CLK outputted from the predetermined circuit 33 of FIG. 23 is applied to a terminal 42. The High-Z detecting circuit 35 of FIG. 23 is connected to the terminal 43. The predetermined circuit 33 of FIG. 23 is connected to the terminal 44. The signal W is used in place of the clock CLK' or signal N in the High-Z detecting circuit of FIG. 3, for example. FIG. 25A shows the clock CLK for providing the operating timing of the judging circuit 36 of FIG. 24. The signal FV shown in FIG. 25B is the signal for enabling the detection in the judging circuit 36 of FIG. 24. The signal FE shown in FIG. 25C is the signal outputted from the High-Z detecting circuit of FIG. 23 to the judging circuit 36 of FIG. 24. The signal NU shown in FIG. 25D is the judgement result of the judging circuit 36 of FIG. 24.

The detection enabling signal FV is set, for example, to 'H' immediately after the reset is released when the system starts up. Then, the detection enabling signal FV is set to "H" for a particular time period when setting the detection enabling signal FV to "H" is explicitly indicated through the microprocessor interface inside the device if the system structure is changed.

With reference to FIGS. 25A to 25D, if the detection result FE of the High-Z detecting circuit 35 becomes "H" while the detection enabling signal FV is "H," the data is latched by the D-latch la2 at the rising edge of the clock CLK, and the non-use information signal NU of the judging circuit 36 becomes 'H', which permits the predetermined circuit 33 to recognize that the external circuit 31 is not connected. The predetermined circuit 33 stops processing the external circuit 31 when the external circuit 31 is not connected, reducing power consumption in the device 30A.

Sixth Preferred Embodiment

Figure 26:
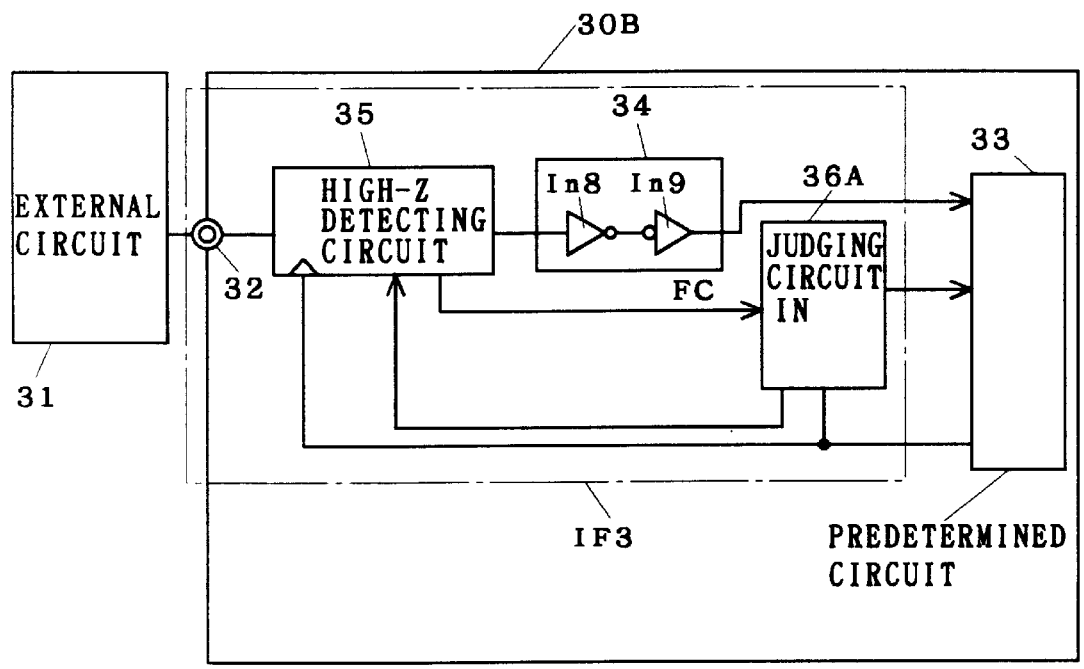
FIG. 26 is a block diagram of the interface circuit according to a sixth preferred embodiment of the present invention.

The interface circuit according to a sixth preferred embodiment of the present invention will be described below with reference to FIG. 26. FIG. 26 is a block diagram of the interface circuit according to the sixth preferred embodiment of the present invention. In FIG. 26, the reference character 36A designates a judging circuit for receiving the detection result FE of the High-Z detecting circuit 35 to continuously judge whether or not the external circuit 31 is connected and to provide information about non-use to the predetermined circuit 33. Other reference numerals and characters designate elements corresponding to those of FIG. 23. An interface circuit IF3 includes the input terminal 32, the input buffer 34, the High-Z detecting circuit 35, and the judging circuit 36A.

To constantly monitoring and judging in real time whether or not the external circuit 31 is connected to the input terminal 32, the judging circuit 36A uses a signal which is the multiplied clock CLK in place of the output from the AND gate An5 providing the data receiving timing of the D-latch of FIG. 24 and the signal W to be applied to the High-Z detecting circuit 35.

The High-Z detecting circuit 35 and the judging circuit 36A continuously perform the High-Z detection to detect the input terminal 32 driven by the external circuit 31. As compared with the software process step which specifies the operation of the predetermined circuit 33, this process enables the detection within a negligible time within the limit. Therefore, the real time detection is accomplished.

Seventh Preferred Embodiment

Figure 27:
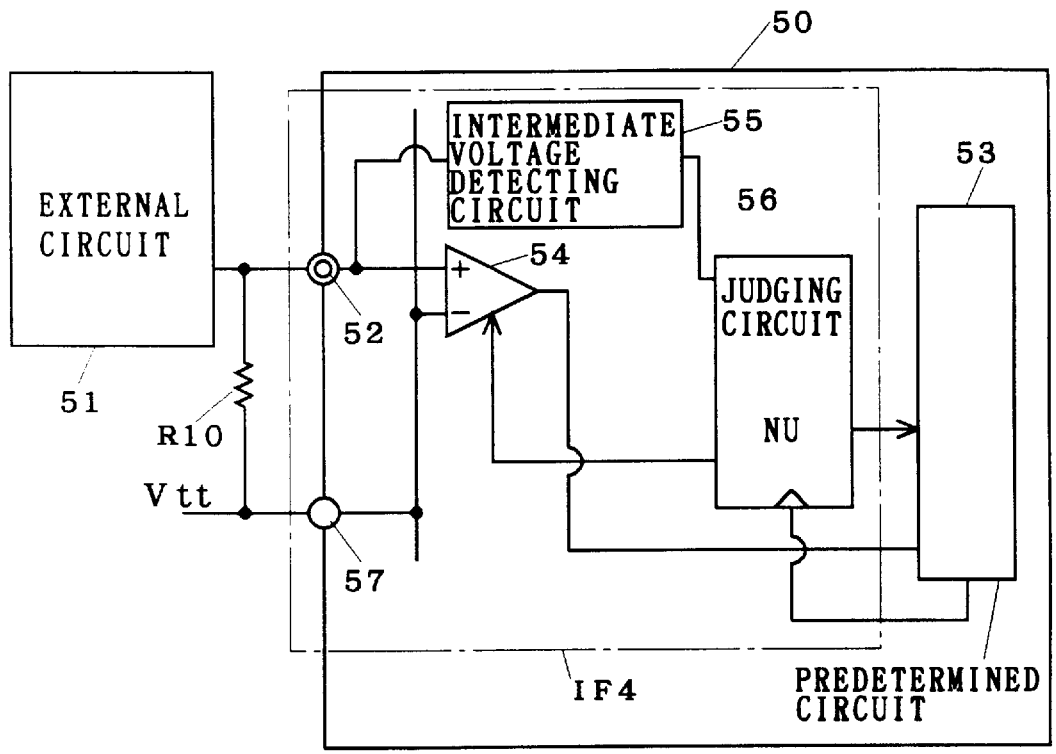
FIG. 27 is a block diagram of the interface circuit according to a seventh preferred embodiment of the present invention.

The interface circuit according to a seventh preferred embodiment of the present invention will be described below with reference to FIGS. 27 through 30E. FIG. 27 is a block diagram of the interface circuit according to the seventh preferred embodiment of the present invention. In FIG. 27, the reference numeral 50 designates a device including an interface circuit IF4; 51 designates an external circuit connected to the interface circuit IF4; 52 designates an input terminal provided in the interface circuit IF4 and connected to the external circuit 51; and 53 designates a predetermined circuit provided in the device 50 for transmitting data to and from the external circuit 51 through the interface circuit IF4. The external circuit 51 outputs a signal at TTL level, for example.

The interface circuit IF4 comprises the input terminal 52 connected to the external circuit 51, a differential amplifier circuit 54 for amplifying a potential difference between a non-inverting input terminal connected to the input terminal 52 and an inverting input terminal, an intermediate voltage detecting circuit 55 for detecting the voltage of the input terminal 52, a judging circuit 56 for judging the use of the input terminal 52 in response to the detection result of the intermediate voltage detecting circuit 55, and a voltage terminal 57 connected to the inverting input terminal of the differential amplifier circuit 57 and receiving a termination voltage Vtt.

When the external circuit 51 is not connected to the input terminal 52, the input terminal 52 is neither "H" nor "L" but at the intermediate voltage Vtt. The intermediate voltage detecting circuit 55 detects the intermediate voltage Vtt to stop the differential amplifier circuit 54 functioning as an input buffer, achieving low power consumption.

At the same time, the judging circuit 56 provides information about the input terminal 52 being not in use to the predetermined circuit 53. A microprocessor for controlling the whole system constructed such that the non-use information signal NU sets a register connected, for example, to the microprocessor interface refers to the register to judge whether the port thereof is in use or is not connected. The microprocessor may achieve high-speed processing by skipping the processing of the port which is not in use, and prevent errors resulting from the receipt of data from the input terminal or port which is not in use.

Figure 28:
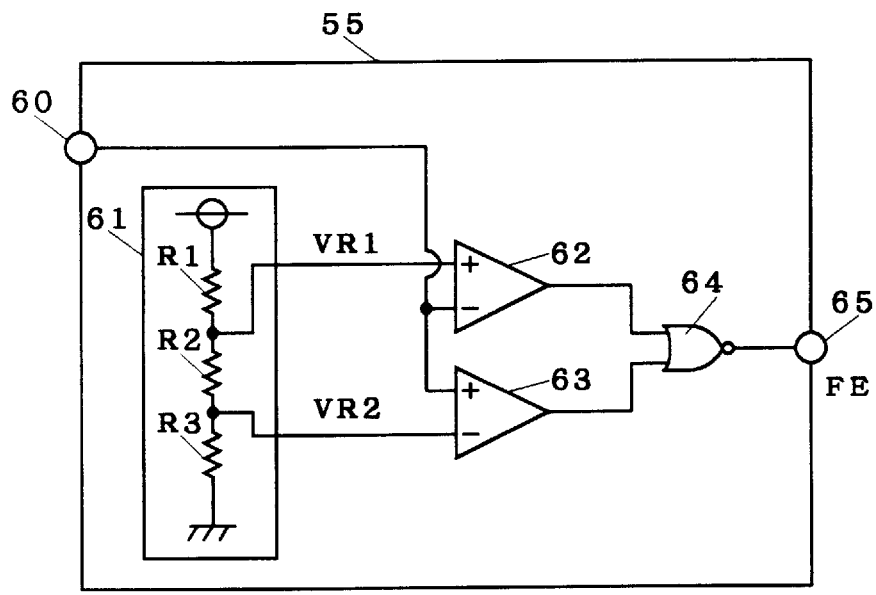
FIG. 28 is a circuit diagram of an intermediate voltage detecting circuit shown in FIG. 27.

FIG. 28 is a circuit diagram of an arrangement of the intermediate voltage detecting circuit 55. In FIG. 28, the reference numeral 60 designates a terminal connected to the input terminal 52 of FIG. 27; 61 designates a reference voltage generating portion for generating upper and lower limit voltages VR1 and VR2 of the intermediate voltage; 62 designates a differential amplifier circuit having an inverting input terminal connected to the terminal 60, a non-inverting input terminal receiving the voltage VR1 from the reference voltage generating portion 61, and an output terminal for outputting the amplified potential difference between the input terminals thereof; 63 designates a differential amplifier circuit having a non-inverting input terminal connected to the terminal 60, an inverting input terminal receiving the voltage VR2 from the reference voltage generating portion 61, and an output terminal for outputting the amplified potential difference between the input terminals thereof; 64 designates a NOR gate for outputting the NOR of the outputs from the differential amplifier circuits 62 and 63 to a terminal 65; and 65 designates a terminal connected to the judging circuit 56 of FIG. 27.

The voltage of the terminal 65 of the intermediate voltage detecting circuit 55 of FIG. 28 is "L" when the voltage of the terminal 60 lies between the power supply voltage Vdd and the voltage VR1 or between the ground voltage GND and the voltage VR2. The voltage of the terminal 65 is "H" when the voltage of the terminal 60 is an intermediate voltage between the voltage VR1 and the voltage VR2.

FIG. 29 is a logic diagram of an arrangement of the judging circuit of FIG. 27. In FIG. 29, the reference character An6 designates an AND gate for outputting the AND of the detection enabling signal FV and the clock CLK; la3 designates a D-latch for holding the detection result FE of the intermediate voltage detecting circuit 55 which is given at a terminal 70 at the rising edge of the output from the AND gate An6; Bu3 designates a buffer for buffering the Q output from the D-latch la3 to output the non-use information signal NU at a terminal 74; and Bu4 designates a buffer for buffering the Q output from the D-latch la3 to output a power down signal PD at a terminal 75. FIG. 30A shows the clock CLK for providing the operating timing of the judging circuit 56 of FIG. 29. The signal FV shown in FIG. 30B is the signal for enabling the detection in the judging circuit 56 of FIG. 29. The signal FE shown in FIG. 30C is the signal outputted from the intermediate voltage detecting circuit 55 of FIG. 27 to the judging circuit 56. The signal NU shown in FIG. 30D is the judgement result of the judging circuit 56 of FIG. 29. The signal PD shown in FIG. 30E is the signal provided from the judging circuit 56 of FIG. 27 to the predetermined circuit 53 and for controlling on/off states of the predetermined circuit 53.

Upon detecting the intermediate voltage, the judging circuit 56 stops the differential amplifier circuit 54 and generates the non-use information signal NU. The detecting timing may be explicitly provided by the detection enabling signal FV. The detection enabling signal FV may be set to "H" immediately after the reset is released when the device 50 starts up, for example. Subsequently, the detection enabling signal FV is set to "H" for a particular time period when setting the detection enabling signal FV is explicitly indicated through the microprocessor interface in the device 50 if the external circuit 51 might be attached or removed to change the structure of the device 50. While the detection enabling signal FV is "H," the detection result FE of the intermediate voltage is received by the D-latch la3. If the detection result FE is "H," the non-use information signal NU and the power down signal PD are set to "H."

The non-use information signal NU is adapted, for example, to set a particular register of the microprocessor interface portion in the device 50. Data are read from the particular register through the microprocessor interface from the exterior of the device 50, whereby a judgement may be made whether or not the input is connected by using the microprocessor in the device 50, for example.

Although the non-use information signal NU is used as the power down signal PD shown in FIG. 29, the microprocessor may indicate the generation of the power down signal PD on the basis of the non-use information signal NU. More specifically, a particular register is allocated to the power down signal PD, and the output of the register should be connected to the differential amplifier circuit 54 for providing the power down signal PD.

The detection enabling signal FV may be provided by dividing the clock to permit the use to be detected periodically.

Eighth Preferred Embodiment

Figure 31:
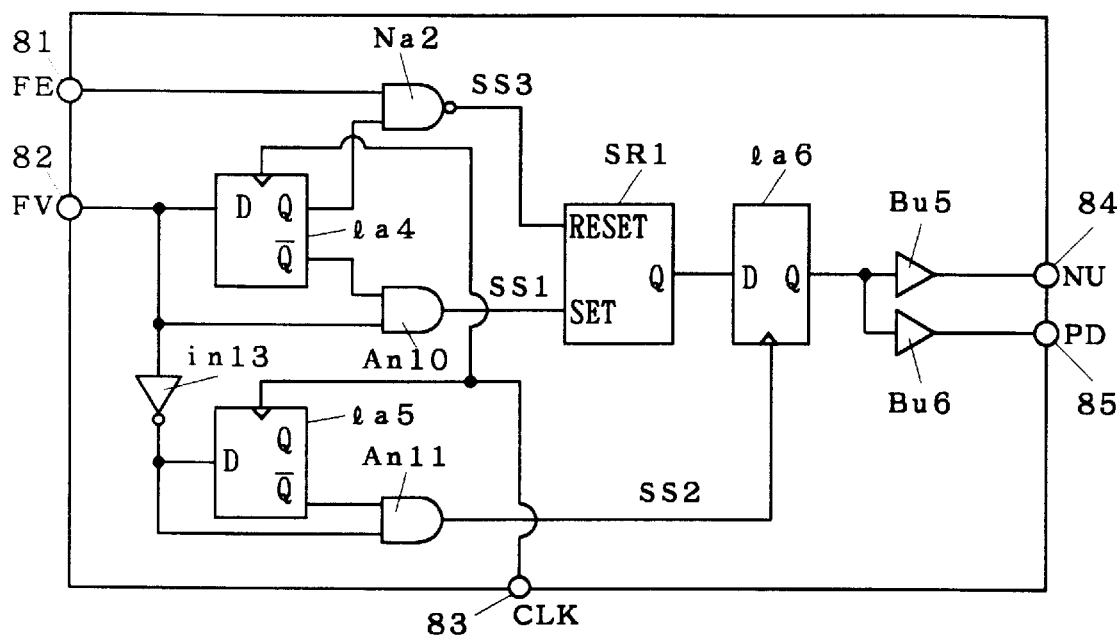
FIG. 31 is a block diagram of the judging circuit for use in the interface circuit according to an eighth preferred embodiment of the present invention.
Figure 32A:
FIGS. 32A to 32E are a timing chart illustrating the operation of the judging circuit of FIG. 31.
Figure 32B:
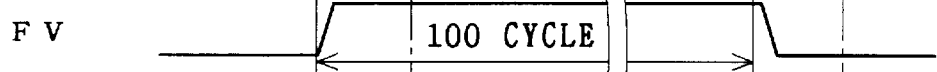
Figure 32C:
Figure 32D:
Figure 32E:
Figure 35:
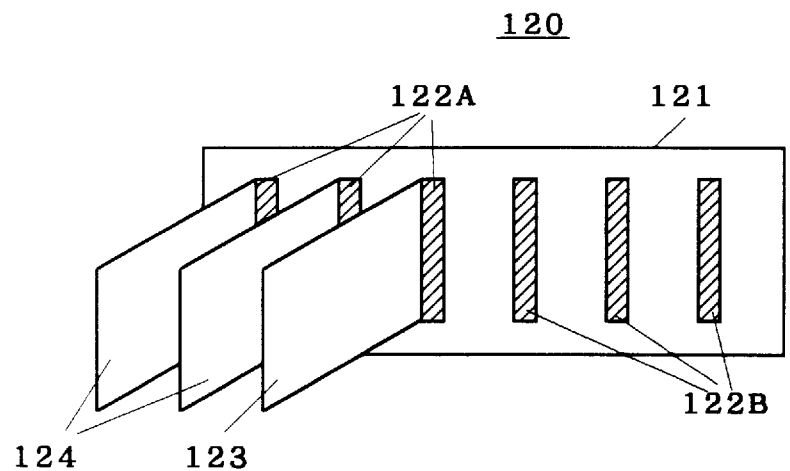
FIG. 35 is a perspective view of the conventional interrace circuit.
Figure 36:
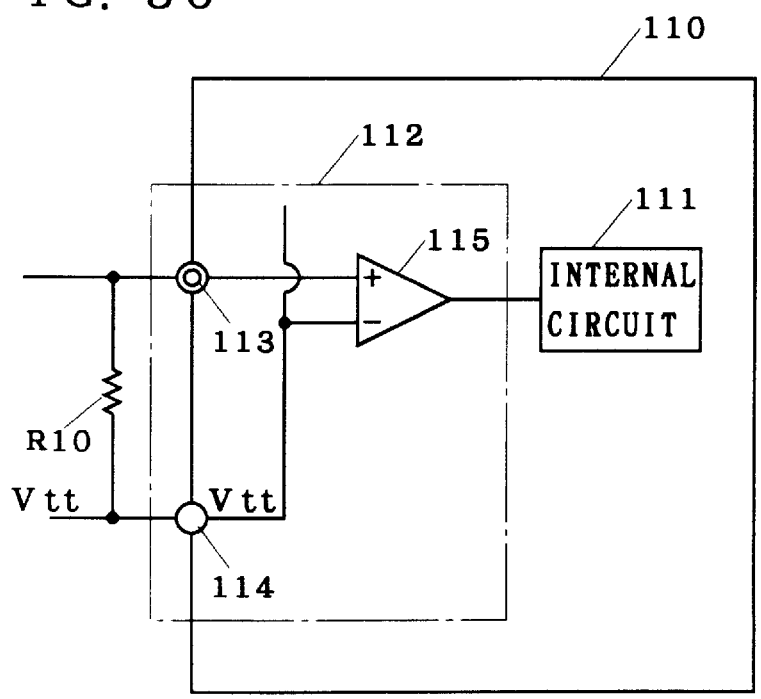
FIG. 36 is a circuit diagram of the conventional interface circuit.

The interface circuit according to an eighth preferred embodiment of the present invention will be discussed below with reference to FIGS. 31 through 32E. FIG. 31 is a circuit diagram of the judging circuit constituting the interface circuit according to the eighth preferred embodiment of the present invention. FIGS. 32A to 32E are a timing chart for illustrating the operation of the judging circuit of FIG. 31.

A judging circuit 80 of FIG. 31 is used in place of the judging circuit 56 of FIG. 27. The judging circuit 80 of FIG. 31 is adapted to judge the intermediate voltage over predetermined cycles. For example, if the intermediate voltage is continuously detected over a time period of 100 cycles of the clock CLK, the judging circuit 80 judges that the external circuit 51 is not connected to the input terminal 52 of FIG. 27 to set the power down signal PD for stopping the differential amplifier circuit 54 to "H." In this manner, the connection is not judged as being established when the intermediate voltage is observed over a plurality of cycles. This avoids the judgement that the connection is not made in response to the detection result FE which is "H" because of a malfunction over one cycle or a relatively short time period, preventing misjudgment.

In FIG. 31, the reference numeral 81 designates a terminal connected to the terminal 65 of the intermediate voltage detecting circuit 55 of FIG. 28; 82 designates a terminal connected to the output terminal of the differential amplifier circuit 54 of FIG. 27; 83 designates a terminal for receiving the clock CLK from the predetermined circuit 53 of FIG. 27; 84 designates a terminal for outputting the non-use information signal NU; 85 designates a terminal for outputting the power down signal PD; the reference character la4 designates a D-latch for receiving the detection enabling signal FV at the falling edge of the clock CLK from the terminal 83 to output the detection enabling signal FV and the inversion thereof as Q and $\overline{Q}$ outputs, respectively; In13 designates an inverter for inverting the detection enabling signal FV from the terminal 82 to output the inverted signal;

la5 designates a D-latch for receiving a D input from the inverter In13 at the rising edge of the clock CLK from the terminal 83 to provide the output from the inverter In13 and the inversion thereof as Q and $\overline{Q}$ outputs, respectively; An10 designates an AND gate for outputting the AND of the a detection enabling signal FV from the terminal 82 and the $\overline{Q}$ output from the D-latch la4 as a signal SS1; An11 designates an AND gate for outputting the AND of the output from the inverter In13 and the $\overline{Q}$ output from the D-latch la5 as a signal SS2; Na2 designates a NAND gate for outputting the NAND of the detection result FE from the terminal 81 and the Q output from the D-latch la4 as a signal SS3; SR1 designates an R-S flip-flop circuit which is set by the signal SS1 to provide 'H' at its Q output, which is reset by the signal SS3 to provide "L" at its Q output, and which is held when both of the signals SS1 and SS3 are "L"; la6 designates a D-latch for receiving the Q output from the R-S flip-flop circuit SR1 at the rising edge of the signal SS2; Bu5 designates a buffer for outputting the Q output of the D-latch la6 at the terminal 84; and Bu6 designates a buffer for outputting the Q output of the D-latch la6 at the terminal 85. FIG. 32A shows the clock CLK for providing the operating timing of the judging circuit 80. The signal FV shown in FIG. 32B is the signal for enabling the detection in the judging circuit 80 of FIG. 31. The signal SS1 shown in FIG. 32C is the signal for setting the R-S flip-flop circuit SR1 of FIG. 31. The signal SS2 shown in FIG. 32D is the signal for providing the data latching timing of the D-latch la6 of FIG. 31. The signal SS3 shown in FIG. 32E is the signal for resetting the R-S flip-flop circuit SR1 of FIG. 31.

The operation of the judging circuit 80 is discussed below with reference to FIGS. 32A to 32E.

(1) During a time period t50, the Q output of the D-latch la4 is 'L' and the Q output of the D-latch la5 is "H".

(2) When the detection enabling signal FV becomes 'H', the output from the AND gate An10 remains "H" during a time period t51 until the clock CLK falls next. Then, the output from the AND gate An10, or the signal SS1, becomes "H" to set the R-S flip-flop circuit SR1.

(3) During time periods t52 and t53, the Q output of the D-latch la4 is "H."Thus, if the High-Z detection result FE becomes "L," the R-S flip-flop circuit SR1 is reset. However, if the detection result FE is always "H" during the time periods t52 and t53, the flip-flop circuit SR1 is not reset but holds "H" at its Q output.

(4) During the time period t53, the output from the AND gate An11, or the signal SS2, holds "H" over a time interval between the falling of the detection enabling signal FV and the next rising of the clock CLK. At the rising edge of the signal SS2, the D-latch la6 receives the Q output of the flip-flop circuit SR1 to hold the same. Thus, the D-latch la6 outputs the non-use information signal NU and power down signal PD which are 'H' if the flip-flop circuit SR1 is not reset until the rising edge of the signal SS2, and outputs the non-use information signal NU and power down signal PD which are "L" if the flip-flop circuit SR1 is reset.

While the invention has been described in detail, the foregoing description is in all aspects illustrative and not restrictive. It is understood that numerous other modifications and variations can be devised without departing from the scope of the invention.

We claim:

1. A high impedance detecting circuit connected to a predetermined node for detecting a high impedance of said predetermined node, said predetermined node being at a high or low level when said predetermined node is closed or at the high impedance when said predetermined node is open upon receipt of an output from a predetermined logic circuit, said high impedance detecting circuit comprising:

first detecting means for detecting a logical value of said predetermined node during a time period over which a state of said predetermined node is held;

voltage applying means for applying to said predetermined node one of first and second voltages providing said high and low levels, respectively, which has a logical value opposite to the detection result of said first detecting means;

applied voltage removing means for removing the voltage applied by said voltage applying means to permit said predetermined node to be re-driven by said predetermined logic circuit;

second detecting means for detecting a logical value of said predetermined node after the applied voltage removal; and judging means for judging the high impedance of said predetermined node on the basis of the detection results of said first and second detecting means.

2. The high impedance detecting circuit of claim 1, wherein said voltage applying means and said applied voltage removing means include first and second switching elements connected in series between a node for providing said first voltage and said predetermined node, said first and second switching elements being turned on and off according to first and second control signals, respectively, and third and fourth switching elements connected in series between a node for providing said second voltage and said predetermined node, said third and fourth switching elements being turned on and off according to third and fourth control signals, respectively, wherein one of said first and third switching elements is turned on according to said first and third control signals in accordance with the detection result of said first detecting means, and wherein both of said second and fourth switching elements are turned on according to said second and fourth control signals for a time period over which voltage is applied to said predetermined node.

3. The high impedance detecting circuit of claim 1, wherein said voltage applying means includes a first switching element having a first terminal receiving said first voltage, a second terminal connected to said predetermined node, and a control terminal, said first switching element being turned on and off in response to a first control signal at its control terminal, and a second switching element having a first terminal receiving said second voltage, a second terminal connected to said predetermined node, and a control terminal, said second switching element being turned on and off in response to a second control signal at its control terminal, said applied voltage removing means outputting third and fourth control signals indicative of time periods over which said first and second switching elements are capable of being on, respectively, said first detecting means outputting a fifth control signal which permits one of said first and second switching elements to be turned on according to the logical value of said predetermined node, said first control signal being produced by a logic operation of said third and fifth control signals, said second control signal being produced by a logic operation of said fourth and fifth control signals.

4. The high impedance detecting circuit of claim 1, wherein said first and second detecting means include buffer means having an input terminal connected to said predetermined node, and an output terminal for outputting a signal having the same logical value as a signal applied to said input terminal, and a switching element having an input terminal connected to said output terminal of said buffer means, an output terminal, and a control terminal receiving a switching signal, and wherein said switching element is placed into a non-conducting state by said switching signal before said voltage applying means starts applying voltage to said predetermined node, to output the detection result of said second detecting means at said input terminal of said switching element, and to output the detection result of said first detecting means at said output terminal of said switching element.

5. The high impedance detecting circuit of claim 1, further comprising:

opening and closing means between said predetermined node and said predetermined logic circuit, said opening and closing means electrically disconnecting the output of said predetermined logic circuit from said predetermined node before said voltage applying means starts applying voltage to said predetermined node, said opening and closing means electrically connecting said predetermined logic circuit to said predetermined node after said applied voltage removing means removes the applied voltage.

6. The high impedance detecting circuit of claim 1, wherein said predetermined logic circuit includes an output circuit connected to said predetermined node for providing an output which is at the high impedance by said switching signal, and wherein said voltage applying means applies voltage to said predetermined node in response to said switching signal when said output of said output circuit is at the high impedance.

7. An interface circuit between a first circuit and a second circuit for transmitting therethrough a digital signal from said first circuit to said second circuit, said interface circuit comprising:

connector for connecting said first circuit to said interface circuit;

a high impedance detecting circuit for detecting whether or not said connector is at a high impedance when said connector is open to provide information to said second circuit;

a judging circuit for judging whether or not said connector is in use during a predetermined time period on the basis of the detection result of said high impedance detecting circuit to provide information about the judgment result to said second circuit, said judging circuit making the judgment again upon receipt of a reset signal to provide information about the judgment result to said second circuit.

8. An interface circuit comprising:

connector means receiving a voltage at an intermediate level which is neither high nor low logic level when not in use for connecting a predetermined circuit;

a differential amplifier circuit between said connector means and said predetermined circuit and having a first input connected to said connector means and a second input receiving the voltage having said intermediate level;

an intermediate voltage detecting circuit for detecting whether or not a voltage of said connector means is at said intermediate level; and a judging circuit for judging whether or not said connector means is in use on the basis of the detection result of said intermediate voltage detecting means to provide information about the judgment result to said predetermined circuit, said differential amplifier circuit being on/off controlled on the basis of the judgment result of said judging circuit.

9. The interface circuit of claim 8, wherein said judging circuit judges that said connector means is in use when receiving the detection result indicative of the detection of the voltage having said intermediate level from said intermediate voltage detecting circuit over a predetermined time period of at least two cycles of a clock providing a timing of changes in output of said predetermined circuit.

10. An interface circuit between a first circuit and a second circuit for transmitting therethrough a digital signal from said first circuit to said second circuit, said interface circuit comprising:

connector for connecting said first circuit to said interface circuit; and a high impedance detecting circuit for detecting whether or not said connector is at a high impedance when said connector is open to provide information to said second circuit;

wherein when detecting high impedance, said high impedance detecting circuit compares a voltage level of said connector before said interface circuit charges said connector, with a voltage level of said connector after said interface circuit charges said connector.

* * * * *